(12) United States Patent
Davis et al.

(10) Patent No.: US 6,505,222 B1
(45) Date of Patent: Jan. 7, 2003

(54) SYSTEMS METHODS AND COMPUTER PROGRAM PRODUCTS FOR CONTROLLING UNDESIRABLE BIAS IN AN EQUALIZER

(75) Inventors: Gordon Taylor Davis, Chapel Hill, NC (US); Malcolm Scott Ware, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,578

(22) Filed: Oct. 29, 1999

(51) Int. Cl.⁷ .................................................. G06F 7/10
(52) U.S. Cl. ...................................... 708/323; 375/233
(58) Field of Search ................................ 708/300, 322, 708/323, 229, 230, 231, 232, 233

(56) References Cited

U.S. PATENT DOCUMENTS

| | | |
|---|---|---|
| 3,557,308 A | 1/1971 | Alexander et al. |
| 3,622,877 A | 11/1971 | MacDavid et al. |
| 3,683,120 A | 8/1972 | Schenkel |
| 3,729,717 A | 4/1973 | de Koe et al. |
| 4,112,427 A | 9/1978 | Hofer et al. |
| 4,132,242 A | 1/1979 | Carroll, Jr. |
| 4,208,630 A | 6/1980 | Martinez |
| 4,237,552 A | 12/1980 | Aikoh et al. |
| 4,270,027 A | 5/1981 | Agrawal et al. |
| 4,434,322 A | 2/1984 | Ferrell |

(List continued on next page.)

FOREIGN PATENT DOCUMENTS

| | | |
|---|---|---|
| EP | 0 473 116 A2 | 8/1991 |
| EP | 0 659 007 A2 | 11/1994 |
| EP | 0 669 740 A2 | 12/1994 |
| FR | 23 45019 | 3/1976 |
| WO | WO 96/18261 | 6/1996 |
| WO | WO 98/37657 | 8/1998 |

OTHER PUBLICATIONS

Erup, et al., Interpolation in Digital Modems—Part II: Implementation and Performance, *IEEE Transactions on Communications*, vol. 41, No. 6, pp. 998–1008 (Jun. 1993).
Fischer, Signal Mapping for PCM Modems, *V–pcm Rapporteur Meeting*, Sunriver, Oregon, USA, 5 pgs. (Sep. 4–12, 1997).

*Primary Examiner*—Chuong Dinh Ngo
(74) *Attorney, Agent, or Firm*—Myers Bigel Sibley & Sajovec, P.A.

(57) ABSTRACT

Bias control systems, methods, and computer program products generate an error signal that corresponds to a difference between a reference signal and an equalizer output signal. The error signal is then filtered using a first filter circuit to generate an error signal average. If the absolute value of the error signal does not exceed a suitable threshold that is proportional to the error signal average, then the error signal is coupled to the equalizer for use in updating the filter coefficients. Furthermore, a second filter circuit may be used to generate an average of selected equalizer output signal samples. If the absolute value of the error signal is greater than the threshold that is proportional to the error signal average, then the reference signal is updated to correspond to the average of selected equalizer output signal samples. Large errors are interpreted as resulting from inaccurate reference signals or reference levels. The reference signals or reference levels may be inaccurate due to the effects of digital impairments in the network, such as RBS, exhibited in the equalizer output signal. Rather than using the error signal to update the equalizer filter coefficients, the reference signal or reference level is updated to correspond to the average of selected equalizer output signal samples. Conversely, small errors are interpreted as an indication that the reference signals or reference levels are accurate and do not require additional refinement. In this case, the error signal is used to update the equalizer filter coefficients.

48 Claims, 9 Drawing Sheets

U.S. PATENT DOCUMENTS

| | | |
|---|---|---|
| 4,450,556 A | 5/1984 | Boleda et al. |
| 4,577,310 A | 3/1986 | Korsky et al. |
| 4,578,796 A | 3/1986 | Charalambous et al. |
| 4,720,861 A | 1/1988 | Bertrand |
| 4,731,816 A | 3/1988 | Hughes-Hartogs |
| 4,756,007 A | 7/1988 | Qureshi et al. |
| 4,760,598 A | 7/1988 | Ferrell |
| 4,797,898 A | 1/1989 | Martinez |
| 4,833,706 A | 5/1989 | Hughes-Hartogs |
| 4,868,863 A | 9/1989 | Hartley et al. |
| 4,884,285 A | 11/1989 | Heynen et al. |
| 4,890,303 A | 12/1989 | Bader |
| 4,890,316 A | 12/1989 | Walsh et al. |
| 4,894,847 A | 1/1990 | Tjahjadi et al. |
| 4,901,333 A | 2/1990 | Hodgkiss |
| 4,943,980 A | 7/1990 | Dobson et al. |
| 4,953,210 A | 8/1990 | McGlynn et al. |
| 4,967,413 A | 10/1990 | Otani |
| 4,972,360 A | 11/1990 | Cuckier et al. |
| 4,985,902 A | 1/1991 | Gurcan |
| 4,991,169 A | 2/1991 | Davis et al. |
| 4,995,030 A | 2/1991 | Helf |
| 5,005,144 A | 4/1991 | Nakajima et al. |
| 5,007,047 A | 4/1991 | Sridhar et al. |
| 5,014,299 A | 5/1991 | Klupt et al. |
| 5,033,062 A | 7/1991 | Morrow et al. |
| 5,038,365 A | 8/1991 | Belloc et al. |
| 5,040,190 A | 8/1991 | Smith et al. |
| 5,052,000 A | 9/1991 | Wang et al. |
| 5,058,134 A | 10/1991 | Chevillat et al. |
| 5,065,410 A | 11/1991 | Yoshida et al. |
| 5,067,125 A | 11/1991 | Tsuchida |
| 5,068,875 A | 11/1991 | Quintin |
| 5,107,520 A | 4/1992 | Karam et al. |
| 5,111,481 A | 5/1992 | Chen et al. |
| 5,119,401 A | 6/1992 | Tsujimoto |
| 5,119,403 A | 6/1992 | Krishnan |
| 5,134,611 A | 7/1992 | Steinka et al. |
| 5,142,552 A | 8/1992 | Tzeng et al. |
| 5,157,690 A | 10/1992 | Buttle |
| 5,187,732 A | 2/1993 | Suzuki |
| 5,210,755 A | 5/1993 | Nagler et al. |
| 5,225,997 A | 7/1993 | Lederer et al. |
| 5,253,272 A | 10/1993 | Jaeger et al. |
| 5,253,291 A | 10/1993 | Naseer et al. |
| 5,265,151 A | 11/1993 | Goldstein |
| 5,285,474 A | 2/1994 | Chow et al. |
| 5,291,479 A | 3/1994 | Vaziri et al. |
| 5,311,578 A | 5/1994 | Bremer et al. |
| 5,317,594 A | 5/1994 | Goldstein |
| 5,351,134 A | 9/1994 | Yaguchi et al. |
| 5,353,280 A | 10/1994 | Ungerböck |
| 5,386,438 A | 1/1995 | England |
| 5,394,110 A | 2/1995 | Mizoguchi |
| 5,394,437 A | 2/1995 | Ayanoglu et al. |
| 5,398,303 A | 3/1995 | Tanaka |
| 5,402,445 A | 3/1995 | Matsuura |
| 5,406,583 A | 4/1995 | Dagdeviren |
| 5,418,842 A | 5/1995 | Cooper |
| 5,432,794 A | 7/1995 | Yaguchi |
| 5,434,884 A | 7/1995 | Rushing et al. |
| 5,475,711 A | 12/1995 | Betts et al. |
| 5,491,720 A | 2/1996 | Davis et al. |
| 5,513,216 A | 4/1996 | Gadot et al. |
| 5,519,703 A | 5/1996 | Cauffour et al. |
| 5,528,625 A | 6/1996 | Ayanoglu et al. |
| 5,528,679 A | 6/1996 | Taarud |
| 5,533,048 A | 7/1996 | Dolan |
| 5,534,913 A | 7/1996 | Majeti et al. |
| 5,546,395 A | 8/1996 | Sharma et al. |
| 5,563,908 A | 10/1996 | Kaku et al. |
| 5,566,211 A | 10/1996 | Choi |
| 5,598,401 A | 1/1997 | Blackwell et al. |
| 5,625,643 A | 4/1997 | Kaku et al. |
| 5,634,022 A | 5/1997 | Crouse et al. |
| 5,640,387 A | 6/1997 | Takahashi et al. |
| 5,646,958 A | 7/1997 | Tsujimoto |
| 5,671,250 A | 9/1997 | Bremer et al. |
| 5,694,420 A | 12/1997 | Ohki et al. |
| 5,710,792 A | 1/1998 | Fukawa et al. |
| 5,724,393 A | 3/1998 | Dagdeviren |
| 5,726,765 A | 3/1998 | Yoshida et al. |
| 5,729,226 A | 3/1998 | Betts et al. |
| 5,732,104 A | 3/1998 | Brown et al. |
| 5,734,663 A | 3/1998 | Eggenberger |
| 5,751,717 A | 5/1998 | Babu et al. |
| 5,751,796 A | 5/1998 | Scott et al. |
| 5,754,594 A | 5/1998 | Betts et al. |
| 5,757,849 A | 5/1998 | Gelblum et al. |
| 5,757,865 A | 5/1998 | Kaku et al. |
| 5,761,247 A | 6/1998 | Betts et al. |
| 5,768,311 A | 6/1998 | Betts et al. |
| 5,778,024 A | 7/1998 | McDonough |
| 5,784,377 A | 7/1998 | Baydar et al. |
| 5,784,405 A | 7/1998 | Betts et al. |
| 5,784,415 A | 7/1998 | Chevillat et al. |
| 5,793,809 A | 8/1998 | Holmquist |
| 5,796,808 A | 8/1998 | Scott et al. |
| 5,801,695 A | 9/1998 | Townshend |
| 5,805,669 A | 9/1998 | Bingel et al. |
| 5,809,075 A | 9/1998 | Townshend |
| 5,812,537 A | 9/1998 | Betts et al. |
| 5,815,534 A | 9/1998 | Glass |
| 5,822,371 A | 10/1998 | Goldstein et al. |
| 5,825,816 A | 10/1998 | Cole et al. |
| 5,825,823 A | 10/1998 | Goldstein et al. |
| 5,831,561 A | 11/1998 | Cai et al. |
| 5,835,532 A | 11/1998 | Strolle et al. |
| 5,835,538 A | 11/1998 | Townshend |
| 5,838,724 A | 11/1998 | Cole et al. |
| 5,839,053 A | 11/1998 | Bosch et al. |
| 5,844,940 A | 12/1998 | Goodson et al. |
| 5,850,388 A | 12/1998 | Anderson et al. |
| 5,850,421 A | 12/1998 | Misra et al. |
| 5,852,631 A | 12/1998 | Scott |
| 5,862,141 A | 1/1999 | Trotter |
| 5,862,179 A | 1/1999 | Goldstein et al. |
| 5,862,184 A | 1/1999 | Goldstein et al. |
| 5,870,429 A | 2/1999 | Moran, III et al. |
| 5,872,817 A | 2/1999 | Wei |
| 5,881,066 A | 3/1999 | Lepitre |
| 5,881,102 A | 3/1999 | Samson |
| 5,887,027 A | 3/1999 | Cohen et al. |
| 5,911,115 A | 6/1999 | Nair et al. |
| 5,914,982 A | 6/1999 | Bjarnason et al. |
| 5,918,204 A | 6/1999 | Tsurumaru |
| 5,926,506 A | 7/1999 | Berthold et al. |

OTHER PUBLICATIONS

Gardner, Interpolation in Digital Modems—Part I: Fundamentals, *IEEE Transactions on Communications*, vol. 41, No. 3, pp. 501–507 (Mar. 1993).

Humblet et al., The Information Driveway, *IEEE Communications Magazine*, pp. 64–68 (Dec. 1996).

Kalet et al., The Capacity of PCM Voiceband Channels, *IEEE International Conference on Communications '93*, pp. 507–511 (Geneva, Switzerland, May 23–26, 1993).

Mueller et al., Timing Recovery in Digital Synchronous Data Receiver, *IEEE Transactions on Communications*, vol. Com-24, No. 5, pp. 516–531 (May 1976).

Pahlavan et al., Nonlinear Quantization and the Design of Coded and Uncoded Signal Constellations, *IEEE Transactions on Communications*, vol. 39, No. 8, pp. 1207–1215 (Aug. 1991).

Proakis, Digital Signaling Over a Channel with Intersymbol Interference, *Digital Communications*, pp. 373, 381 (McGraw–Hill Book Company, 1983).

A Digital Modem and Analogue Modem Pair for Use on the Public Switched Telephone Network (PSTN) at Data Signalling Rates of Up to 56 000 Bit/s Downstream and 33 600 Bit/s Upstream, *ITU–T V.90* (Sep. 1998).

Series V: Data Communication Over the Telephone Network; Interfaces and voiceband modems; A modem operating at data signalling rates of up to 33 600 bit/s for use on the general switched telephone network and on leased point–to–point 2–wire telephone type circuits, *ITU–T V.34* (10/96).

Bell, R.A., et al., Automatic Speed Reduction and Switched Network Back–up, *IBM Technical Disclosure Bulletin*, vol. 32, No. 1, pp. 154–157 (Jun. 1989).

Abbiate, J.C., et al., Variable–Data Transmission Modem, *IBM Technical Disclosure Bulletin*, vol. 17, No. 11, pp. 3301–3302 (Apr. 1975).

Data Communication Over the Telephone Network; Procedures for Starting Sessions of Data Transmission Over the General Switched Telephone Network, *ITU–T V.8* (09/94).

Line Quality Monitoring Method, *IBM Technical Disclosure Bulletin*, vol. 18, No. 8, pp. 2726–2726 (Jan. 1976).

Loopback Tests for V.54 Data Communication Equipment, *IBM Technical Disclosure Bulletin*, vol. 32, No. 3A, pp. 295–299 (Aug. 1989).

On–Line Real Time Modem Testing, *IBM Technical Disclosure Bulletin*, vol. 20, No. 6, pp. 2252–2254 (Nov. 1977).

Pierobon, Gianfranco L., Codes of Zero Spectral Density at Zero Frequency, *IEEE Transactions on Information Theory*, vol. IT–30, No. 2, pp. 435–439 (Mar., 1984).

Marcus, Brian H, et al., On Codes with Spectral Nulls at Rational Submultiples of the Symbol Frequency, *IEEE Transactions on Information Theory*, vol. IT–33, No. 4, pp. 557–568 (Jul. 1987).

Fischer, Robert, et al., Signal Mapping for PCM Modems, *ITU–Telecommunications Standardization Sector PCM '97–120, V.pcm Rapporteur Meeting*, (Sunriver, Oregon; Sep. 4–12, 1997).

Pulse Code Modulation (PCM) of Voice Frequencies, *ITU–T*, Recommendation G.711 (Geneva, 1972).

Series G: Digital Transmission Systems; Terminal equipments—Coding of analogue signals by pulse code modulation; Pulse code modulation (PCM) of voice frequencies, *ITU–T*, Recommendation G.711 (Geneva, 1996).

Data Communication Over the Telephone Network; Error–Correcting Procedures for DCEs Using Asynchronous–to–Synchronous Conversion, *ITU–T V.42* (03/93).

Improvement to Spectral Shaping Technique, *Research Disclosure*, V. 41, n415,415111, pp. 1550–1551 (Nov. 1998).

TIA Standard Draft: North American Telephone Network Transmission Model for Evaluating Analog Client to Digitally Connected Server Modems, Telecommunications Industry Association, PN3857,Draft 10 (Feb. 1999).

Davis, Gordon T., DSP and MATLAB implementation of model–based constellation generation (Sep. 18, 1998).

Woodruff, K.R., et al, Automatic and Adaptive System and Efficient Communication in Noisy Communication Line Environments, *IBM Technical Disclosure Bulletin*, vol. 24, No. 9, pp. 4627–4629 (Feb. 1982).

Godard, D., et al., Decision Feedback Equalizer Stabilization in Adaptive Mode, *IBM Technical Disclosure Bulletin*, vol. 24, No. 11A, pp. 5691–5692 (Apr. 1982).

Borgnis–Desbordes, P., et al., Variable–Speed Data Transmission, *IBM Techincal Disclosure Bulletin*, vol. 27, No. 4A, pp. 2269–2270 (Sep. 1984).

Couland, G., et al., Analog Wrap Self–Test in Modems During Retrain Operations, *IBM Technical Disclosure Bulletin*, vol. 28, No. 6, pp. 2457 (Nov. 1985).

Maddens, F., Sixteen–State Forward Convolutional Encoder, *IBM Technical Disclosure Bulletin*, vol. 28, No. 6, pp. 2466–2468 (Nov. 1985).

Remote Modem–Type Self–Learning, *IBM Technical Disclosure Bulletin*, vol. 28, No. 6, pp. 2398–2399 (Nov. 1985).

Maddens, F., Sixteen–State Feedback Convolutional Encoder, *IBM Technical Disclosure Bulletin*, vol. 28, No. 10, pp. 4212–4213 (Mar. 1986).

Bell, R. A., et al., Automatic Speed Reduction and Switched Network Back–up, *IBM Technical Disclosure Bulletin*, vol. 32, No. 1, pp. 154–157 (Jun. 1989).

Nobakht, R.A., Trellis–Coded Modulation Coding Scheme for a 19/2 Kbps Modem, *IBM Technical Disclosure Bulletin*, vol. 36, No. 11, pp. 167–170 (Nov. 1993).

Nobakht, R.A., Unified Table Based Subset Decoder for the Viterbi Algorithm, *IBM Technical Disclosure Bulletin*, vol. 37, No. 09, pp. 581–587 (Sep. 1994).

Nobakht, R.A., Trellis Subset Decoder Algorithm Based on a Pattern Recognition Scheme, *IBM Technical Disclosure Bulletin*, vol. 37, No. 10, pp. 693–697 (Oct. 1994).

Abbiate, J.C., et al, Variable–Data Transmission Modem, *IBM Technical Disclosure Bulletin*, vol. 17, No. 11, pp. 3301–3302 (Apr. 1975).

Barlet, J., et al., Full Speed Recovery in High Speed Modems, *IBM Technical Disclosure Bulletin*, vol. 23, No. 2, pp. 641–643 (Jul. 1980).

Dialog Abstract, Sample rate converter for duplex modem, European Patent No. 285413 10/88.

Dialog Abstract, Two–speed full–duplex modem for telephone network, PCT No. WO 8501407 03/85.

Dialog Abstract, Digital data transmission system, European Patent No. 124674 11/84.

Dialog Abstract, Facsimile communication controller, Japanese Publication No. 04–175060 (Jun. 23, 1992).

Dialog Abstract, Picture communication equipment, Japanese Publication No. 03–120954 (May 23, 1991).

Dialog Abstract, Radio date transmission system, Japanese Publication No. 01–179535 (Jul. 17, 1989).

Dialog Abstract, Facsimile device, Japanese Publication No. 57–164654 (Oct. 9, 1982).

Dialog Abstract, Data repeater, Japanese Publication No. 57–087255 (May 31, 1982).

Dialog Abstract, Blinding training method for decision feedback equaliser having feed–forward and feedback filters, European Patent No. 880253 11/98.

Dialog Abstract, Processing method for distorted signal received by qam receiver, European Patent No. 465851 01/92.

Dialog Abstract, Establishing wireless communication channel, PCT No. WO 9905820 02/99.

Dialog Abstract, High–speed rate adaptive subscriber line digital data modem, PCT No. WO 9830001 07/98.

Dialog Abstract, Digital modem in digital modulation system, Japanese Patent No. 8116341 05/96.

Dialog Abstract, Communication equipment and radio communication adapter, Japanese Publication No. 08–340289 (Dec. 24, 1996).

Dialog Abstract, Data recording method, Japanese Publication No. 05–089597 (Apr. 9, 1993).

Dialog Abstract, Transmission control system for data communication and its modem equipment, Japanese Publication No. 02–228853 (Sep. 11, 1990).

Naguib, A.F., et al., Dialog Abstract, A space–time coding modem for high–data–rate wireless communications, *IEEE Journal of Selected Areas in Communications*, vol. 16, No. 8, pp. 1459–1478 (Oct. 1998).

Denno, S., et al., Dialog Abstract, Mbit/s burst modem with an adaptive equalizer for TDMA mobile radio communications, *IEICE Transactions on Communications*, vol. E81–B, No. 7, pp. 1453–1461 (Jul. 1998).

Naguib, A.F., et al., Dialog Abstract, A space–time coding modem for high–data–rate wireless communications, *GLOBECOM 97, IEEE Global Telecommunications Conference*, vol. 1, pp. 102–109 (1997).

Kobayashi, K., et al., Dialog Abstract, Fully digital burst modem for satellite multimedia communication systems, *IEICE Transactions on Communications*, vol. E80–B, No. 1, pp. 8–15 (Jan. 1997).

Skellern, D.J., et al., Dialog Abstract, A high speed wireless LAN, *IEEE Micro*, vol. 17, No. 1, pp. 40–47 (Jan.–Feb. 1997).

Enomoto, K., et al., Dialog Abstract, A mode switching type burst demodulator AFC, *Transactions of the Institute of Electronics, Information and Communication Engineers*, vol. J76B–II, No. 5, pp. 415–421 (May 1993).

Betts, W., Dialog Abstract, Nonlinear encoding by surface projection, *International Conference on Data Transmission—Advances in Modem and ISDN Technology and Applications* (Sep. 23–25, 1992).

Schilling, D.L., et al., Dialog Abstract, The FAVR meteor burst communication experiment, *Military Communications in a Changing World MILCOM '91* (Nov. 4–7, 1991).

Jacobsmeyer, J.M., Dialog Abstract, Adaptive trellis–coded modulation for bandlimited meteor burst channels, *IEEE Journal on Selected Areas in Communications*, vol. 10, No. 3, pp. 550–561 (Apr. 1992).

Sato, T., et al., Dialog Abstract, Protocol configuration and verification of an adaptive error control scheme over analog cellular networks, *IEEE Transactions on Vehicular Technology*, vol. 41, No. 1, pp. 69–76 (Feb. 1992).

Lee, L.–N., et al., Dialog Abstract, Digital signal processor–based programmable BPSK/QPSK/offset–QPSK modems, *COMSAT Technical Review*, pp. 195–234 (Fall 1989).

Sato, T., et al., Dialog Abstract, Error–free high–speed data modem, *Oki Technical Review*, vol. 56, No. 133, pp. 20–26 (Apr. 1989).

Seo, J.–S, et al., Dialog Abstract, Performance of convolutional coded SQAM in hardlimited satellite channels, *IEEE International Conference on Communications BOSTON-ICC/89*, vol. 2, pp. 787–791 (Jun. 11–14, 1989).

Murakama, K., et al., Dialog Abstract, FEC combined burst–modem for business satellite communications use, *IEEE/IECE Global Telecommunications Conference 1987*, vol. 1, pp. 274–280 (Japan, Nov. 15–18, 1987).

McVerry, F., Dialog Abstract, Performance of a fast carrier recovery scheme for burst–format DQPSK transmission over satellite channels, *International Conference on Digital Processing of Signals in Communications*, pp. 165–172 (United Kingdom, 1985).

Filter, J.H.J., Dialog Abstract, An algorithm for detecting loss of synchronisation in data transmission test sets (modems), *Transactions of the South African Institute of Electrical Engineers*, vol. 76, No. 1, pp. 39–43 (Jan. 1985).

Gersho, A., Dialog Abstract, Reduced complexity implementation of passband adaptive equilizers, *IEEE Journal on Selected Areas in Communications*, vol. SAC–2, No. 5, pp. 778–779 (Sep. 1984).

Dialog Abstract, High–speed full–duplex modem reduces telephone connect time, *EDN*, vol. 27, No. 18, p. 77 (Sep. 15, 1982).

Chadwick, H., et al., Dialog Abstract, Performance of a TDMA burst modem through a dual nonlinear satellite channel, *Fifth International Conference on Digital Satellite Communications*, pp. 63–67 (Italy, Mar. 23–26, 1981).

Nussbaumer, H., Dialog Abstract, Reducing the acquisition time in an automatic equalizer, *IBM Technical Disclosure Bulletin*, vol. 18, No. 5, pp. 1465–1479 (Oct. 1975).

Uzunoglu, V., et al., Dialog Abstract, Synchronous and the coherent phase–locked synchronous oscillators: new techniques in synchronization and tracking, *IEEE Transactions on Circuits and Systems*, vol. 36, No. 7, pp. 997–1004 (Jul. 1989).

Minei, I., et al., Dialog Abstract, High–speed Internet access through unidirectional geostationary satellite channels, *IEEE Journal on Selected Areas in Communications*, vol. 17, No. 2, pp. 345–59 (Feb. 1999).

Ovadia, S., Dialog Abstract, The effect of interleaver depth and QAM channel frequency offset on the performance of multichannel AM–VSB/256–QAM video lightwave transmission systems, *International Conference on Telecommunications: Bridging East and West Through Communications*, vol. 1, pp. 339–343 (Greece, Jun. 21–25, 1998).

Johnson, R. W., et al., Dialog Abstract, Error correction coding for serial–tone HG transmission, *Seventh International Conference on HF Radio Systems and Techniques*, pp. 80–84 (United Kingdom, Jul. 7–10, 1997).

Karasawa, Y., et al., Dialog Abstract, Cycle slip in clock recovery on frequency–selective fading channels, *IEEE Transactions on Communications*, vol. 45, No. 3, pp. 376–383 (Mar. 1997).

Umehira, M., et al., Dialog Abstract, Design and performance of burst carrier recovery using a phase compensated filter, *Transactions of the Institute of Electronics, Information and Communication Engineers*, vol. J78B–II, No. 12, pp. 735–746 (Dec. 1995).

De Bot, P., et al., Dialog Abstract, An example of a multi–resolution digital terrestrial TV modem, *Proceedings of ICC '93—IEEE International Conference on Communications*, vol. 3, pp. 1785–1790 (Switzerland, May 23–26, 1993).

Lei, Chen, et al., Dialog Abstract, Single–tone HF high speed data modem, *Proceedings of TENCON '93—IEEE Region 10 International Conference on Computers, Communications and Automation*, vol. 3, pp. 94–98 (China, Oct. 19–21, 1993).

Woerner, B.D., et al., Dialog Abstract, Simulation issues for future wireless modems, *IEEE Communications*, vol. 32, No. 7, pp. 42–53 (Jul. 1994).

Sato, T., et al., Dialog Abstract, Vehicle terminal equipment with dedicated DSP, *Oki Technical Review*, vol. 58, No. 144, pp. 49–52 (Jul. 1992).

Sato, T., et al., Dialog Abstract, Protocol Configuration and verification of an adaptive error control scheme over analog cellular networks, *IEEE Transactions on Vehicular Technology*, vol. 41, No. 1, pp. 69–76 (Feb. 1992).

Tamm, Yu.A., Dialog Abstract, The effect of suppressing harmonic interference using an adaptive equalizer, *Elektrosvyaz*, vol. 45, No. 3, pp. 5–10 (Mar. 1990).

Saleh, A.A.M., et al., Dialog Abstract, An experimental TDMA indoor radio communications systemusing slow frequency hopping and coding, *IEEE Transactions on Communications*, vol. 39, No. 1, pp. 152–162 (Jan., 1991).

Nergris, A., Dialog Abstract, Optimum HF digital communication systems with block coding and interleaving techniques, *Proceedings of the 1990 Bilkent International Conference on New Trends in Communication, Control and Signal Processing*, vol. 1, pp. 511–517 (Turkey, Jul. 2–5, 1990).

Kawamata, F., et al., Dialog Abstract, An evaluation of voice codecs and facsimilies, *Review of the Communications Research Laboratory*, vol. 36, pp. 69–73 (Mar. 1990).

Sato, T., et al., Dialog Abstract, Error–free high–speed data transmission protocol simultaneously applicable to both wire and mobile radio channels, *38th IEEE Vehicular Technology Conference: 'Telecommunications Freedom—Technology on the Move'*, pp. 489–496 (Jun. 15–17, 1988).

Dialog Abstract, 1200–bit/s cellular modem DLD03H, *Oki Technical Review*, vol. 53, No. 127, pp. 70–72 (Jul. 1987).

Chamberlin, J.W., et al., Dialog Abstract, Design and field test of a 256–QAM DIV modem, *IEEE Journal on Selected Areas in Communications*, vol. SAC–5, No. 3, pp. 349–356 (Apr. 1987).

De Cristofaro, R., et al., Dialog Abstract, A 120 Bv/s QPSK modem designed for the INTELSAT TMDA network, *International Journal of Satellite Communications*, vol. 3, Nos. 1–2, pp. 145–160 (Jan.Jun., 1985).

Shumate, A., Dialog Abstract, Error correction coding for channels subject to occasional losses of bit count integrity, *IEEE Military Communications Conference*, vol. 1, pp. 89–83 (Oct. 21–24, 1984).

Suyderhoud, H., et al., Dialog Abstract, Investigation of 9.6 kb/s data transmission via a PCM link at 64 kb/s with and without link errors, *International Journal of Satellite Communications*, vol. 2, No. 1, pp. 81–87 (Jan.–Mar., 1984).

Smith, C., Dialog Abstract, Relating the performance of speech processors to the bit error rate, *Speech Technology*, vol. 2, No. 1, pp. 41–53 (Sep.–Oct. 1983).

Suyderhoud, H., et al., Dialog Abstract, Investigation of 9.6–kbit/s data transmission via a PCM link at 64 kbit/s with and without link errors, *Sixth International Conference on Digital Satellite Communications Proceedings*, pp. 26–33 (Sep. 19, 23, 1983).

Kittel, L., Dialog Abstract, Analogue and discrete channel models for signal transmission in mobile radio, *Frequenz*, vol. 36, Nos. 4–5, pp. 153–160 (Apr.–May 1982).

Farrell, P.G., et al., Dialog Abstract, Soft–decision error control of h.f. data transmission, *IEE Proceedings F (Communications, Radar and Signal Processing)*, vol. 127, No. 5, pp. 389–400 (Oct. 1980).

Johnson, A.L., Dialog Abstract, Simulation and implementation of a modulation system for overcomming ionospheric scintillation fading, *AGARD Conference Proceedings No. 173 on Radio Systems and the Ionosphere*, pp. 3/1–5 (Greece, May 26–30, 1975).

Matsumara, K., et al., Dialog Abstract, Anti–interference data–transmission set of HF radio equipment, *Mitsubishi Electric Engineer*, No. 41; pp. 18–23 (Sep., 1974).

Blank, H.A., et al., Dialog Abstract, A Markov error channel model, *1973 National Telecommunications Conference*, vol. 1, pp. 15B/1–8 (Nov. 26–28, 1973).

McGruther, W.G., Dialog Abstract, Long term error performance data for operation at 2400 bps ona nonswitched private line network, *Summaries of papers presented at 1970 Canadian symposium on communications*, pp. 65–66 (Canada, Nov. 12–13, 1970).

Burton, H.O., et al., Dialog Abstract, On the use of error statistics from data transmission on telephone facilities to estimate performance of forward–error–correction, *1970 international conference on communications*, p. 21 (Jun. 8–10, 1970).

Bowen, R.R., Dialog Abstract, Application on burst error correction codes to data modems for dispersive channels, *Proceedings of the 1970 international symposium on information theory*, p. 1 (Netherlands, Jun. 15–19, 1970).

Pierce, A.W., et al., Dialog Abstract, Effective application of forward–acting error–control coding to multichannel h.f. data modems, *IEEE Transactions on Communication Technology*, vol. Com–18, No. 4, pp. 281–294 (Aug. 1970).

West, R.L., Abstract, Data Concentration Method, *IBM Technical Disclosure Bulletin*, pp. 487–489; http://w3.infogate.ibm.com:1207/SESS506884/GETDOC/39/2/1 (Jul., 1975).

Haas, L.C., et al., Abstract, Received Line Signal Quality Analysis, *IBM Technical Disclosure Bulletin*, pp. 5414–5416; http://w3.infogate.ibm.com:1207/SESS506884/GETDOC/43/1/1 (May, 1981).

Nussbaumer, H., Abstract, Reducing the Acquisition Time in an Automatic Equalizer, *IBM Technical Disclosure Bulletin*, pp. 1465–1479; http://w3.infogate.ibm.com:1207/SESS50-6884/GETDOC/40/2/1 (Oct. 1975).

Dialog Abstract, Listener echo canceller for digital communication system, PCT No. WO 9310607 05/93.

Dialog Abstract, Reduced time remote access method for modem computer, PCT No. WO 9209165 05/92.

SYSTEMS METHODS AND COMPUTER PROGRAM PRODUCTS FOR CONTROLLING UNDESIRABLE BIAS IN AN EQUALIZER

FIELD OF THE INVENTION

The present invention relates generally to the field of digital signal processing, and, more particularly, to controlling undesirable bias in equalizers.

BACKGROUND OF THE INVENTION

The demand for remote access to information sources and data retrieval, as evidenced by the success of services such as the World Wide Web, is a driving force for high-speed network access technologies. The public switched telephone network (PSTN) offers standard voice services over a 4 kHz bandwidth. Traditional analog modem standards generally assume that both ends of a modem communication session have an analog connection to the PSTN. Because data signals are typically converted from digital to analog when transmitted towards the PSTN and then from analog to digital when received from the PSTN, data rates may be limited to 33.6 kbps as defined in the V.34 Transmission Recommendation developed by the International Telecommunications Union (ITU).

The need for an analog modem may be eliminated, however, by using the basic rate interface (BRI) of the Integrated Services Digital Network (ISDN). A BRI offers end-to-end digital connectivity at an aggregate data rate of 160 kbps, which is comprised of two 64 kbps B channels, a 16 kbps D channel, and a separate maintenance channel. ISDN offers comfortable data rates for Internet access, telecommuting, remote education services, and some forms of video conferencing. ISDN deployment, however, has generally been very slow due to the substantial investment required of network providers for new equipment. Because ISDN is not very pervasive in the PSTN, the network providers have typically tariffed ISDN services at relatively high rates, which may be ultimately passed on to the ISDN subscribers. In addition to the high service costs, subscribers must generally purchase or lease network termination equipment to access the ISDN.

While most subscribers do not enjoy end-to-end digital connectivity through the PSTN, the PSTN is nevertheless mostly digital. Typically, the only analog portion of the PSTN is the phone line or local loop that connects a subscriber or client modem (e.g., an individual subscriber in a home, office, or hotel) to the telephone company's central office (CO). Local telephone companies have been replacing portions of their original analog networks with digital switching equipment. Nevertheless, the connection between the home and the CO has been the slowest to change to digital as discussed in the foregoing with respect to ISDN BRI service. A recent data transmission recommendation issued by the ITU, known as V.90, takes advantage of the digital conversions that have been made in the PSTN. By viewing the PSTN as a digital network, V.90 technology can accelerate data downstream from the Internet or other information source to a subscriber's computer at data rates of up to 56 kbps, even when the subscriber is connected to the PSTN via an analog local loop.

To understand how the V.90 Recommendation achieves this higher data rate, it may be helpful to briefly review the operation of V.34 analog modems. V.34 modems are generally optimized for a configuration in which both ends of a communication session are connected to the PSTN by analog lines. Even though most of the PSTN is digital, V.34 modems treat the network as if it were entirely analog. Moreover, the V.34 Recommendation assumes that both ends of the communication session suffer impairment due to quantization noise introduced by analog-to-digital converters. That is, the analog signals transmitted from the V.34 modems are sampled at 8000 times per second by a codec upon reaching the PSTN with each sample being represented or quantized by an eight-bit pulse code modulation (PCM) codeword. The codec uses 256, non-uniformly spaced, PCM quantization levels defined according to either the $\mu$-law or A-law companding standard (i.e., the ITU G.711 Recommendation).

Because the analog waveforms are continuous and the binary PCM codewords are discrete, the digits that are sent across the PSTN can only approximate the original analog waveform. The difference between the original analog waveform and the reconstructed quantized waveform is called quantization noise, which limits the modem data rate.

While quantization noise may limit a V.34 communication session to 33.6 kbps, it nevertheless affects only analog-to-digital conversions. The V.90 standard relies on the lack of analog-to-digital conversions in the downstream path, outside of the conversion made at the subscriber's modem, to enable transmission at 56 kbps.

The general environment for which the V.90 standard has been developed is depicted in FIG. 1. An Internet Service provider (ISP) 22 is connected to a subscriber's computer 24 via a V.90 digital server modem 26, through the PSTN 28 via digital trunks (e.g., T1, E1, or ISDN primary Rate Interface (PRI) connections), through a central office switch 32, and finally through an analog loop to the client's modem 34. The central office switch 32 is drawn outside of the PSTN 28 to better illustrate the connection of the subscriber's computer 24 and modem 34 into the PSTN 28. It should be understood that the central office 32 is, in fact, a part of the PSTN 28. The operation of a communication session between the subscriber 24 and an ISP 22 is best described with reference to the more detailed block diagram of FIG. 2.

Transmission from the server modem 26 to the client modem 34 will be described first. The information to be transmitted is first encoded using only the 256 PCM codewords used by the digital switching and transmission equipment in the PSTN 28. These PCM codewords are transmitted towards the PSTN 28 by the PCM transmitter 36 where they are received by a network codec. The PCM data is then transmitted through the PSTN 28 until reaching the central office 32 to which the client modem 34 is connected. Before transmitting the PCM data to the client modem 34, the data is converted from its current form as either $\mu$-law or A-law companded PCM codewords to pulse amplitude modulated (PAM) voltages by the codec expander (digital-to-analog (D/A) converter) 38. These PAM voltage levels are processed by a central office hybrid 42 where the unidirectional signal received from the codec expander 38 is transmitted towards the client modem 34 as part of a bidirectional signal. A second hybrid 44 at the subscriber's analog telephone connection converts the bidirectional signal back into a pair of unidirectional signals. Finally, the analog signal from the hybrid 44 is converted into digital PAM samples by an analog-to-digital (A/D) converter 46, which are received and decoded by the PAM receiver 48. Note that for transmission to succeed effectively at 56 kbps, there must be only a single digital-to-analog conversion and subsequent analog-to-digital conversion between the server modem 26 and the client modem 34. Recall that analog-to-digital conversions in the PSTN 28 may introduce quantization noise, which may limit the data rate as discussed hereinbefore. The A/D converter 46 at the client modem 34, however, may have a higher resolution than the A/D converters used in the analog portion of the PSTN 28 (e.g., 16 bits versus 8 bits), which results in less quantization noise. Moreover, the PAM receiver 48 needs to be in synchronization with the 8 kHz network clock to properly decode the digital PAM samples.

Transmission from the client modem 34 to the server modem 26 follows the V.34 data transmission standard. That is, the client modem 34 includes a V.34 transmitter 52 and a D/A converter 54 that encode and modulate the digital data to be sent using techniques such as quadrature amplitude modulation (QAM). The hybrid 44 converts the unidirectional signal from the digital-to-analog converter 54 into a bidirectional signal that is transmitted to the central office 32. Once the signal is received at the central office 32, the central office hybrid 42 converts the bidirectional signal into a unidirectional signal that is provided to the central office codec. This unidirectional, analog signal is converted into either µ-law or A-law companded PCM codewords by the codec compressor (A/D converter) 56, which are then transmitted through the PSTN 28 until reaching the server modem 26. The server modem 26 includes a conventional V.34 receiver 58 for demodulating and decoding the data sent by the V.34 transmitter 52 in the client modem 34. Thus, data is transferred from the client modem 34 to the server modem 26 at data rates of up to 33.6 kbps as provided for in the V.34 standard.

The V.90 standard offers increased data rates (e.g., data rates up to 56 kbps) in the downstream direction from a server to a subscriber or client. Upstream communication still takes place at conventional data rates as provided for in the V.34 standard. Nevertheless, this asymmetry may be particularly well suited for Internet access. For example, when accessing the Internet, high bandwidth is most useful when downloading large text, video, and audio files to a subscriber's computer. Using V.90, these data transfers can be made at up to 56 kbps. On the other hand, traffic flow from the subscriber to an ISP consists mainly of keystroke and mouse commands, which are readily handled by the conventional rates provided by V.34.

As described above, the digital portion of the PSTN 28 transmits information using eight-bit PCM codewords at a frequency of 8000 Hz. Thus, it would appear that downstream transmission should take place at 64 kbps rather than 56 kbps as defined by the V.90 standard. While 64 kbps is a theoretical maximum, several factors prevent actual transmission rates from reaching this ideal rate. First, even though the problem of quantization error has been substantially eliminated by using PCM encoding and PAM for transmission, additional noise in the network or at the subscriber premises, such as non-linear distortion and crosstalk, may limit the maximum data rate. Furthermore, the µ-law or A-law companding techniques do not use uniform PAM voltage levels for defining the PCM codewords. The PCM codewords representing very low levels of sound have PAM voltage levels spaced close together. Noisy transmission facilities may prevent these PAM voltage levels from being distinguished from one another thereby causing loss of data. Accordingly, to provide greater separation between the PAM voltages used for transmission, not all of the 256 PCM codewords are used.

It is generally known that, assuming a convolutional coding scheme, such as trellis coding, is not used, the number of symbols required to transmit a certain data rate is given by Equation 1:

$$bps = R_s \log_2 N_s \qquad \text{EQ. 1}$$

where bps is the data rate in bits per second, $R_s$ is the symbol rate, and $N_s$ is the number of symbols in the signaling alphabet or constellation. To transmit at 56 kbps using a symbol rate of 8000, Equation 1 can be rewritten to solve for the number of symbols required as set forth below in Equation 2:

$$N_s = 2^{56000/8000} = 128 \qquad \text{EQ. 2}$$

Thus, the 128 most robust codewords of the 256 available PCM codewords are chosen for transmission as part of the V.90 standard.

The V.90 standard, therefore, provides a framework for transmitting data at rates up to 56 kbps provided the network is capable of supporting the higher rates. The most notable requirement is that there can be at most one digital-to-analog conversion and no analog-to-digital conversion in the downstream path in the network. Nevertheless, other digital impairments, such as robbed bit signaling (RBS) and digital mapping through PADs, which results in attenuated signals, may also inhibit transmission at V.90 rates. Communication channels exhibiting non-linear frequency response characteristics are yet another impediment to transmission at the V.90 rates. Moreover, these other factors may limit conventional V.90 performance to less than the 56 kbps theoretical data rate.

In addition to the foregoing factors, errors in demodulating the V.90 signal in the client modem 34 may also affect V.90 performance. The PAM receiver 48 may include an equalizer, such as a decision feedback equalizer (DFE), for demodulating the incoming V.90 signal. During startup procedures for the client modem 34, equalizer training is typically performed in which the serve modem 26 sends a binary signal with a constant amplitude and a sign bit controlled by a scrambler circuit to the client modem 34. As this signal propagates through the digital portion of the network, digital impairments, such as digital attenuation PADs and RBS may alter it. Digital attenuation PADs may be compensated for in the client modem 34 by boosting the gain applied to the incoming signal through, for example, an automatic gain control circuit. Unfortunately, RBS may alter the levels (i.e., PAM signal levels) of some symbols (i.e., PCM codewords) relative to others.

To overcome the effects of RBS during equalizer training, the client modem 34 preferably selects a symbol that is consistent regardless of any RBS that may be used in the digital network. This ideal solution, however, may be very difficult to achieve in practice. For example, it may be impossible to choose a symbol that is unaffected by RBS after attenuation by a digital PAD for all possible digital PADs that may be used.

The digital PSTN 28 transports information using a six symbol framing structure. That is, a frame comprises six data frame intervals with each data frame interval holding a single symbol. Any pattern of altered PAM signal levels caused by RBS will, therefore, repeat every six symbols. Thus, during equalizer training, the training symbol may be consistently biased away from the expected PAM level in one or more of the data frame intervals as a result of RBS. The equalizer will typically attempt to compensate for this bias by updating its filter coefficients, which may introduce an unwanted bias into the filter coefficients and limit the achievable performance for the connection.

Consequently, there exists a need for improvements in modem receivers that may reduce the impact of RBS on equalizer training.

SUMMARY OF THE INVENTION

It is an object of the present invention to provide bias control systems, methods, and computer program products that may improve equalizer performance.

It is another object of the present invention to provide bias control systems, methods, and computer program products that may be used to reduce the bias that may be introduced into equalizer filter coefficients due to RBS.

These and other objects, advantages, and features of the present invention may be provided by bias control systems, methods, and computer program products in which an error signal is generated that corresponds to a difference between a reference signal and an equalizer output signal. The error signal is then filtered using a first filter circuit to generate an error signal average. If the absolute value of the error signal does not exceed the error signal average or, alternatively, a suitable threshold proportional to the error signal average, then the error signal is coupled to the equalizer for use in updating the filter coefficients. Furthermore, in accordance with another aspect of the present invention, a second filter circuit may be used to generate an average of selected equalizer output signal samples. If the absolute value of the error signal is greater than the error signal average or, alternatively, a suitable threshold proportional to the error signal average, then the reference signal is updated to correspond to the average of selectee equalizer output signal samples.

Large errors may be interpreted as resulting from inaccurate reference signals or reference levels. The reference signals or reference levels may be inaccurate due to the effects of digital impairments in the network, such as RBS, exhibited in the equalizer output signal. Advantageously, the reference signal or reference level is updated to correspond to average of selected equalizer output signal samples rather than using the error signal to update the equalizer filter coefficients. Conversely, small errors may be interpreted as an indication that the reference signals or reference levels are accurate and do not require additional refinement. In this case, the error signal is used to update the equalizer filter coefficients.

The ITU V.90 Recommendation provides for data transmission via data frames. A data frame comprises six data frame intervals with each interval holding a single symbol. Moreover, the data frame intervals may be exposed to different digital impairments, such as different RBS schemes and/or different PAD attenuation levels. Therefore, in accordance with yet another aspect of the present invention, a magnitude of the reference signal is stored for each of a plurality of data frame intervals.

The average of equalizer output signal samples may be generated by multiplying the magnitude of the reference signal for one of the plurality of data frame intervals by a first weight factor, multiplying the equalizer output signal by a second weight factor, and then adding the results of the two multiplication operations to arrive at a new value for the reference signal. The two weight factors are preferably fractional values whose sum is equal to one. In a preferred embodiment, the first weight factor is set to $63/64$ and the second weight factor is set to $1/64$.

Similarly, the error signal average may be generated by multiplying a previous error signal average by a first weight factor, multiplying the absolute value of the error signal by a second weight factor, and then adding the results of the two multiplication operations. The two weight factors are preferably fractional values whose sum is equal to one. In a preferred embodiment, the first weight factor is set to $31/32$ and the second weight factor is set to $1/32$.

In accordance with still another aspect of the present invention, the error signal may be scaled before it is used to generate the error signal average. The scaling constant or factor may be adjusted so that the error signal average is a suitable threshold for concluding that the error signal is sufficiently large to indicate that the reference signal is inaccurate.

Thus, the bias control systems, methods, and computer program products of the present invention may be used to address the problem of an equalizer in a client modem adjusting its coefficients during the training procedure to adapt to both biased training signal PAM levels (i.e., those affected by digital impairments) and unbiased training signal PAM levels. Such adaptation may result in a compromise set of equalizer coefficients that are biased away from the values that would be attained absent the effects of digital impairments in the network. By using the error signal for coefficient updating only when the error signal is "small" (i.e., less than or equal to an error signal average, which is typically based on a scaled version of the error signal), the likelihood of introducing an undesirable bias into the equalizer coefficients may be reduced.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numbers signify like elements throughout the description of the figures.

The present invention may be embodied as an equalizer bias control system, a method, or a computer program product. Accordingly, the present invention may take the form of an entirely hardware embodiment, an entirely software (including firmware, resident software, micro-code, etc.) embodiment, or an embodiment containing both software and hardware aspects. Furthermore, the present invention may take the form of a computer program product on a computer-usable or computer-readable storage medium having computer-usable program code means embodied in the medium for use by or in connection with an instruction execution system. In the context of this document, a computer-usable or computer-readable medium may be any means that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted or otherwise processed in a suitable manner if necessary, and then stored in a computer memory.

Computer program code for carrying out operations of the present invention may be written in a high level programming language such as C or C++. Some modules or routines, however, may be written in assembly language, machine language, or micro-code to optimize speed, memory usage, or layout of the software or firmware in memory. In a preferred embodiment, the present invention uses microcode to implement most software programs.

V.90 Client Modem Architecture

Figure 1:
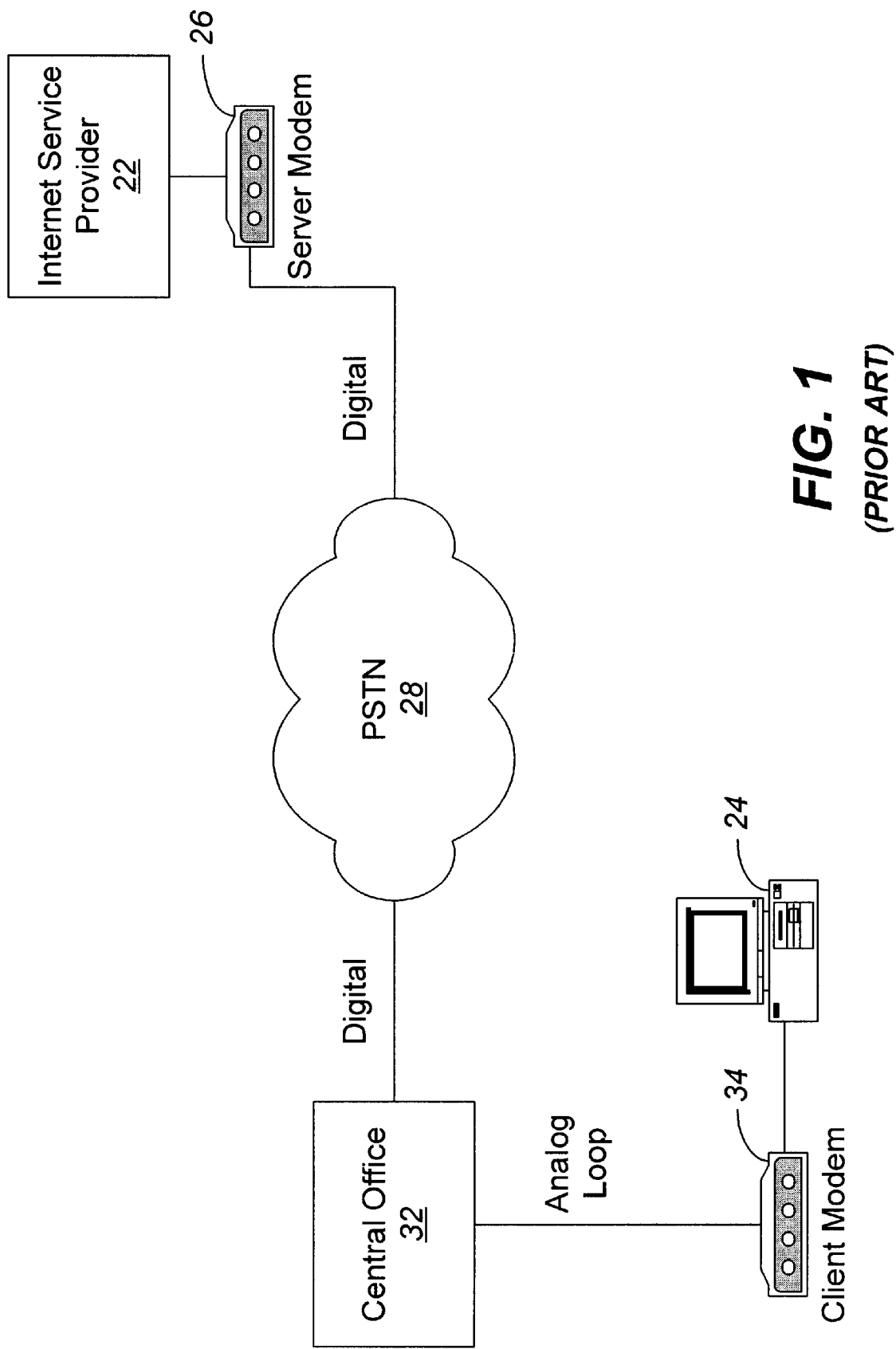
FIG. 1 is block diagram that illustrates a typical V.90 connection between a subscriber and an ISP in accordance with the prior art.
Figure 2:
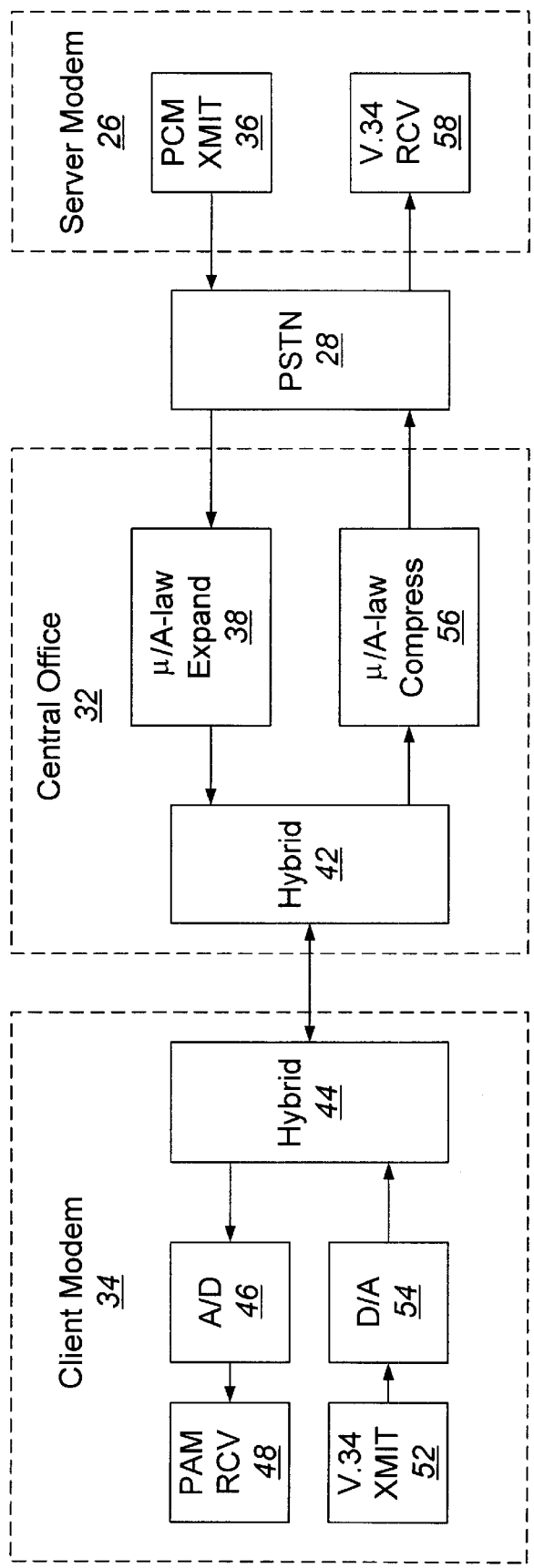
FIG. 2 is a block diagram that illustrates an internal architecture of a client modem, a central office, and a server modem shown in FIG. 1 and connections therebetween.
Figure 3:
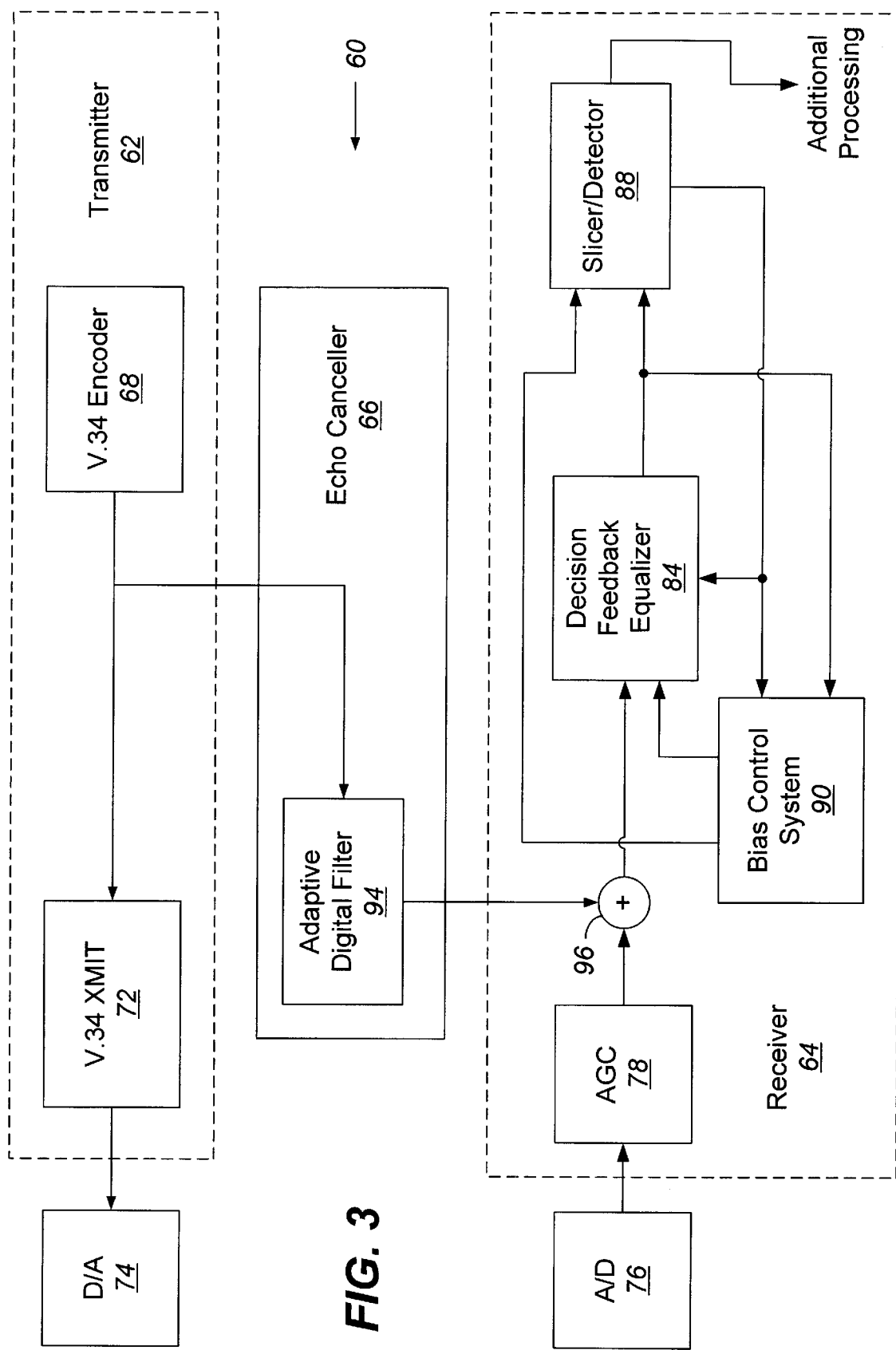
FIG. 3 is a block diagram that illustrates an exemplary V.90 client modem in accordance with the present invention.

A block diagram of a V.90 client modem 60 according to an illustrative embodiment of the present invention is shown in FIG. 3. The V.90 modem 60 includes a V.34 transmitter 62 and a PAM receiver 64, which are coupled together by an echo canceller 66. The transmitter 62 includes a V.34 encoder 68 that encodes the data to be transferred, typically using trellis coding, and then provides the encoded data to a V.34 transmit unit 72. The V.34 transmit unit 72 in conjunction with the D/A converter 74 transmits the encoded data towards the network using, for example, QAM modulation.

The receiver 64 receives a PAM signal from the network through an A/D converter 76. The digital samples from the A/D converter 76 are applied to an automatic gain control (AGC) component 78, which applies the amount of gain that may be needed to compensate for attenuation in the network and/or in the local loop.

Once the digitized signal has been amplified by the AGC component 78, the signal is received by an adaptive fractionally spaced decision feedback equalizer (DFE) 84. After the digitized signal is filtered by the decision feedback equalizer 84, the signal is received by the slicer/detector 88, which converts the digital samples into indices by comparing the digital samples with thresholds that are half-way between indexed reference signal levels comprising the PAM signaling alphabet. These indices may then be processed further to reconstruct the original data stream that a remote system has transmitted to the subscriber or client. The receiver 64 further includes a bias control system 90 that is used to control undesirable bias in the decision feedback equalizer 84 that may result from RBS in the network. The bias control system 90 receives the equalizer output samples from the decision feedback equalizer 84 as input. Furthermore, the bias control system 90 provides reference signals or PAM reference levels to the slicer/detector 88 for use in training of the decision feedback equalizer 84 and also selectively provides an error signal (i.e., difference between the slicer/detector 88 output and the decision feedback equalizer 84 output) to the decision feedback equalizer 84 for use in updating the filter coefficients of the decision feedback equalizer 84. A preferred architecture and operations of the bias control system 90 will be described in detail hereinafter.

When the V.34 signal transmitted by transmitter 62 is received by the line termination equipment in the central office, portions of this signal may reflect back towards the V.90 client modem 60, thereby creating a disturbing echo signal superimposed on the incoming PAM signals. The echo canceller 66 is used to filter out this echo signal so that it does not interfere with the performance of the receiver 64. More specifically, the echo canceller 66 receives a complex T-spaced symbol stream from the V.34 encoder 68 and produces a real, T/k fractionally spaced symbol stream as an output, where k is an integer number and T refers to the modulation interval, which is generally given by the inverse of the symbol (baud) or sample rate. Selection of the integer k depends on the sampling rate used by the front end of the receiver 64 (i. e., the A/D converter 76 and the AGC 78). The echo canceller 66 in accordance with the present invention comprises an adaptive digital filter 94 that performs both an interpolation function as well as a filtering function. The sampling rate used in the V.34 encoder 68 is typically different from the sampling rate used by the front end of the receiver 64. In a preferred embodiment, the V.34 encoder 68 operates at 3200 samples per second while the digital samples from the AGC 78 are output at 9600 samples per second. Thus, the adaptive digital filter 94 is used to match the sampling rate of the transmitter 62 with the sampling rate of the receiver 64 by interpolating the samples from the V.34 encoder 68 up to the 9600 samples per second rate. To achieve this level of interpolation, k is typically set to three in a preferred embodiment. Note that because the transmitter 62 and the receiver 64 share the same local clock, the echo canceller 66 need not perform a clock synchronization function in addition to the interpolation.

The adaptive digital filter 94 may be implemented as a finite impulse response (FIR) filter comprising a tapped delay line with associated tap coefficients. The output from the adaptive digital filter 94 is combined with the digitized signal from the AGC 78 in an adder 96. Desirably, the output from the adaptive digital filter 94 should complement the echo signal reflecting back from the local loop to effectively cancel its effect upon the received PAM signal. Because the symbols from the V.34 encoder 68 are generally encoded as complex values when QAM modulation is used, the tap coefficients for the adaptive digital filter 94 are designed to convert from the complex domain to the real domain as the digital samples representing the PAM signals in the receiver 64 are real values. Typically, the tap coefficients for the adaptive digital filter 94 are trained during a startup interval for the V.90 modem 60 in which test signals are transmitted from the transmitter 62 and the coefficients are adjusted until the output from the adder 96 is approximately null.

An interpolator (not shown) may be used in conjunction with the decision feedback equalizer 84 to match the sampling rate of the receiver 64 with the sampling rate of the network, which is 8000 samples per second. In a preferred embodiment, the sampling rate used by the A/D converter 76 and the AGC 78 is 9600 samples per second.

Figure 4:
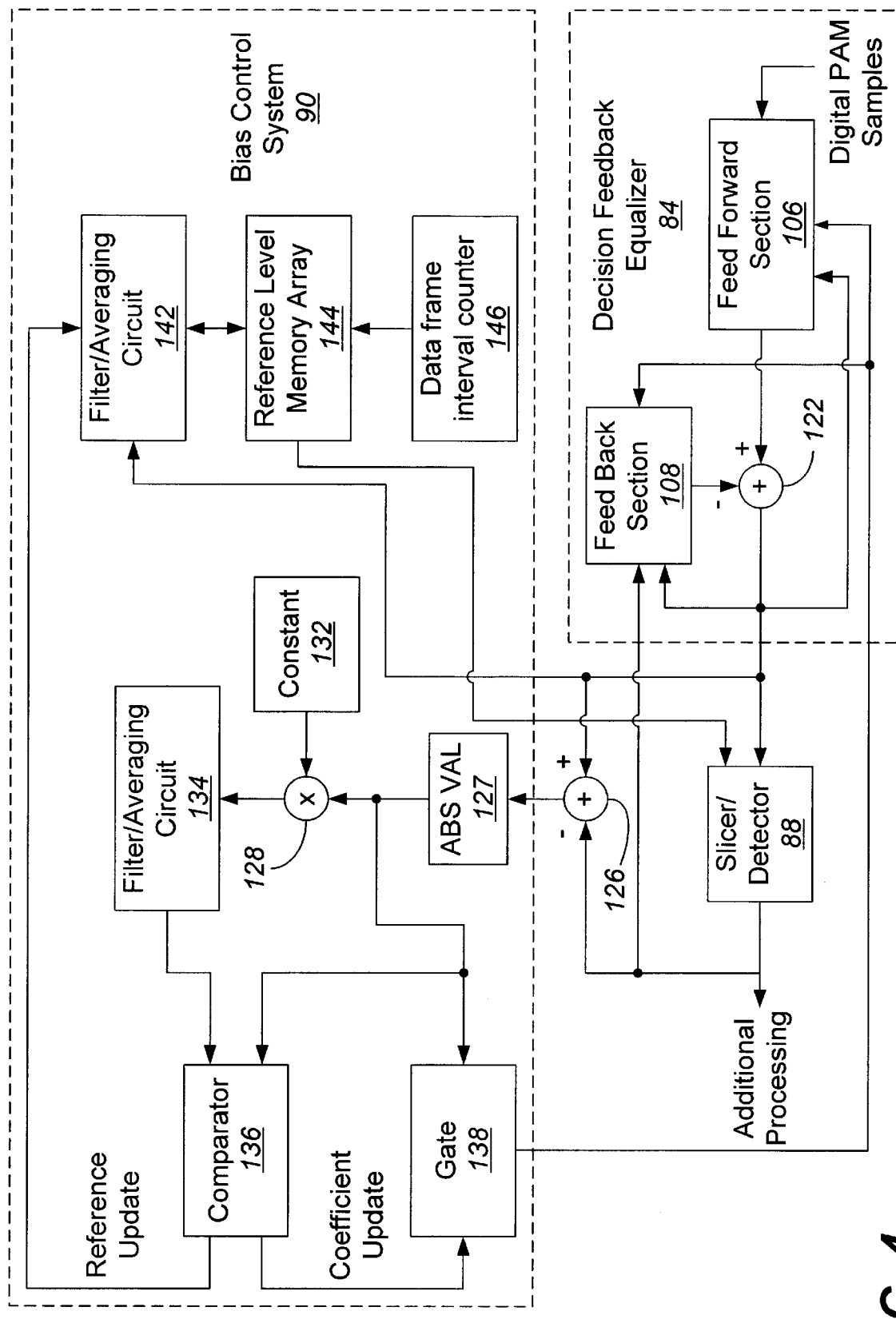
FIG. 4 is a block diagram of a bias control system and a decision feedback equalizer (DFE) shown in FIG. 3 that illustrates bias control systems, methods, and computer program products in accordance with the present invention.

With reference now to FIG. 4, a preferred architecture of the decision feedback equalizer 84 and the bias control system 90 will be described in greater detail. The decision feedback equalizer 84 comprises a feed forward section 106 and a feed back section 108 and typically provides some level of interpolation or decimation to the sampling rate. For example, in a preferred embodiment of the present invention, the feed forward section 106 receives input samples with a sampling interval of T/q and filters these input samples through use of a tapped delay line having a tap spacing of pT/q. Recall that T corresponds to the modulation interval, which is ⅛₀₀₀ samples per second (i.e., the network sampling rate). The specific choice of values for p and q is generally based on a compromise between computational complexity, storage requirements, and bandwidth availability. In a preferred embodiment, p and q are set to three and four respectively; therefore, the digital samples are interpolated from 9600 samples per second up to 32000 samples per second. Then, once the samples are decimated by the decision feedback equalizer 84, the digital samples are provided to the slicer/detector 88 at the network sampling rate of 8000 samples per second.

Figure 5:
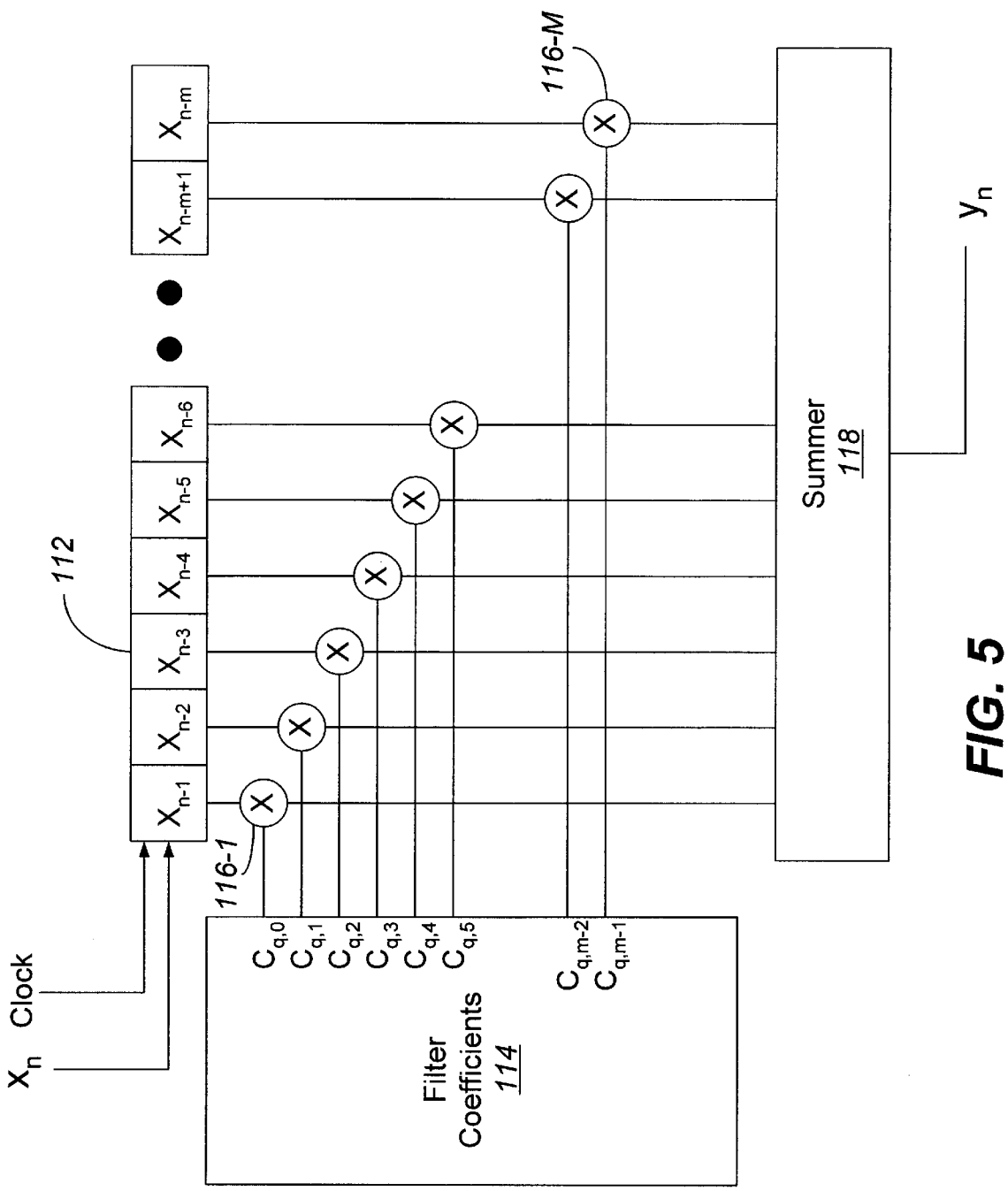
FIG. 5 is a block diagram that illustrates an adaptive digital filter of a type that may be used in an adaptive fractionally spaced decision feedback equalizer shown in FIGS. 3 and 4 and in an echo canceller shown in FIG. 3.

FIG. 5 shows the general structure of an adaptive FIR filter, which is a preferred implementation for the feed forward section 106, the feed back section 108, and the adaptive digital filter 94 (see FIG. 3) used in the echo canceller 66. The operation of an FIR digital filter can generally be represented by Equation 3 set forth below:

$$Y_n = \sum_{k=1}^{k=m} C_k^n X_{n-k} \qquad \text{EQ. 3}$$

where $Y_n$ is the output at time n, $C_k^n$ is the $k^{th}$ coefficient at time n and $X_{n-k}$ is the input at time n-k. Typically, the collection of samples $X_{n-1}$ through $X_{n-m}$ are stored in a tapped delay line 112. The characteristics of the filter are determined by the values of the coefficients 114 at time n. Each coefficient is also called a tap weight or tap coefficient. Each coefficient, $C_k^n$, is used to multiply the respective sample of X(t) through a corresponding multiplier 116-$i$ with the result that $Y_n$ is equal to the sum of the products of the coefficients and the respective m samples of X(t), which is output from a summer 118. This approach of generating output samples $Y_n$ based on a weighted summation of prior-in-time input samples combats the effects of noise, attenuation, and inter-symbol interference (ISI) due to delay and distortion caused by the communication channel.

Returning to FIG. 4, the feed forward section 106 is used to filter the digital samples to counteract the effects of channel amplitude and phase distortion due to the communication channel. These filtered samples are then applied to the slicer/detector 88 through an adder 122. The slicer/detector 88 converts the digital samples from the output of the adder 122 to indices by comparing the samples with a PAM signaling alphabet comprising indexed reference signal levels. Ultimately, these indices are decoded into a stream of digital data to be provided to a destination that corresponds to the original data sent from a message source.

The slicer/detector 88 also outputs the reference signal levels corresponding to these indices. This second output of the slicer/detector 88 is provided to the feed back section 108 and an adder 126.

A first feedback loop is formed through the adder 126 and the bias control system 90. The adder 126 is used for generating an error signal, which is defined as the difference between the received signal at the input of the slicer/detector 88 and the detected signal as determined by the slicer/detector 88. This error signal is used to adapt the coefficients of the feed forward section 106 and the feed back section 108 to the characteristics of the communication channel. As will be explained in more detail hereafter, the bias control system 90 is used to regulate when (i.e., under what circumstances or conditions) the error signal from the adder 126 is fed back to the decision feedback equalizer 84 to update the coefficients of the decision feedback equalizer 84.

A second feedback loop is included that couples the output of the slicer/detector 88 through the feed back section 108 to the adder 122. The feed back section 108 is used to further refine the digital samples that are applied to the detector/slicer 88. Specifically, the signal samples input to the feed back section 108 are reference signal levels from the slicer/detector 88 and are, thus, uncorrupted by noise as long as the slicer/detector 88 is correctly estimating or detecting the transmitted PAM symbols. Therefore, the feed back section 108 is designed primarily to reduce the effects of ISI due to the delay characteristics of the communication channel.

The bias control system 90 may be used to improve the training of the decision feedback equalizer 84 or "tuning" of the decision feedback equalizer 84 coefficients by preventing coefficient updates that may be based on received PAM signal levels that are biased due to RBS. The bias control system 90, may include an absolute value unit 127 that generates the absolute value or magnitude of the error signal generated by the adder 126. Note that the absolute value unit 127 may be designed to generate the absolute value or magnitude of the error signal or may alternatively be designed to square the error signal to generate a positive signal. The absolute value unit 127 may allow the absolute value functionality to be removed from other components for improved efficiency. The bias control system 90 preferably includes a multiplier or scaling circuit 128 that receives the error signal from the adder 126 and scales the error signal using the constant 132. The scaled error signal is provided as an input to a filter/averaging circuit 134, which maintains a running average of the error signal. The error signal average from the filter/averaging circuit 134 and the error signal from the adder 126 are provided as inputs to a comparator 136.

The comparator 136 determines whether the absolute value of the error signal from the adder 126 is greater than the error signal average from the filter/averaging circuit 134, and, based on this result, asserts either a coefficient update signal or a reference update signal. More specifically, if the absolute value of the error signal is less than or equal to the error signal average, then the comparator 136 asserts the coefficient update signal. The coefficient update signal is provided as an input to a gate 138 such that when the comparator 136 asserts the coefficient update signal, the gate 138 couples the error signal from the adder 126 to the decision feedback equalizer 84 for use in updating the filter coefficients. If, on the other hand, the absolute value of the error signal is greater than the error signal average, then the comparator 136 asserts the reference update signal.

The reference update signal is provided as an input to a filtering/averaging circuit 142, which generates an average of the equalizer output signal using selected signal samples that are output from the decision feedback equalizer 84. The reference update signal is used to enable the filter/averaging circuit 142 to update a reference signal or reference level (i.e., magnitude of the PAM signal associated with the symbol selected for equalizer training) stored in a reference level memory array 144 to correspond to the average of selected equalizer output signal samples. Recall, however, that information transmitted from a server modem to a V.90 client modem is encoded using a six symbol framing structure. A frame comprises six data frame intervals with each data frame interval holding a single symbol. The reference level memory array 144, therefore, holds the reference signals or reference levels for the symbol selected by the V.90 client modem 60 to be used for equalizer training for each of the six data frame intervals. Ideally, the training symbol would be represented by the same reference signal or reference level in each of the six data frame intervals. Because of digital impairments, such as RBS, which may affect one data frame interval differently than another, the reference signal or reference levels associated with the training symbol may differ across the six data frame intervals.

Accordingly, a data frame interval counter 146 is used to index the reference level memory array 144 to identify the data frame interval associated with the output signal sample from the decision feedback equalizer 84. The slicer/detector 88 correlates the reference signals or reference levels from the reference level memory array 144 with the output signal samples from the decision feedback equalizer 84.

The receiver structure described hereinabove lends itself to an efficient implementation requiring approximately eighteen million instructions per second (MIPS) in a typical digital signal processor. Moreover, the receiver structure is compatible with existing analog front ends and transmitters designed for the V.34 or other comparable legacy recommendation standards.

V.90 Client Modem Receiver Software Architecture

Figure 6:
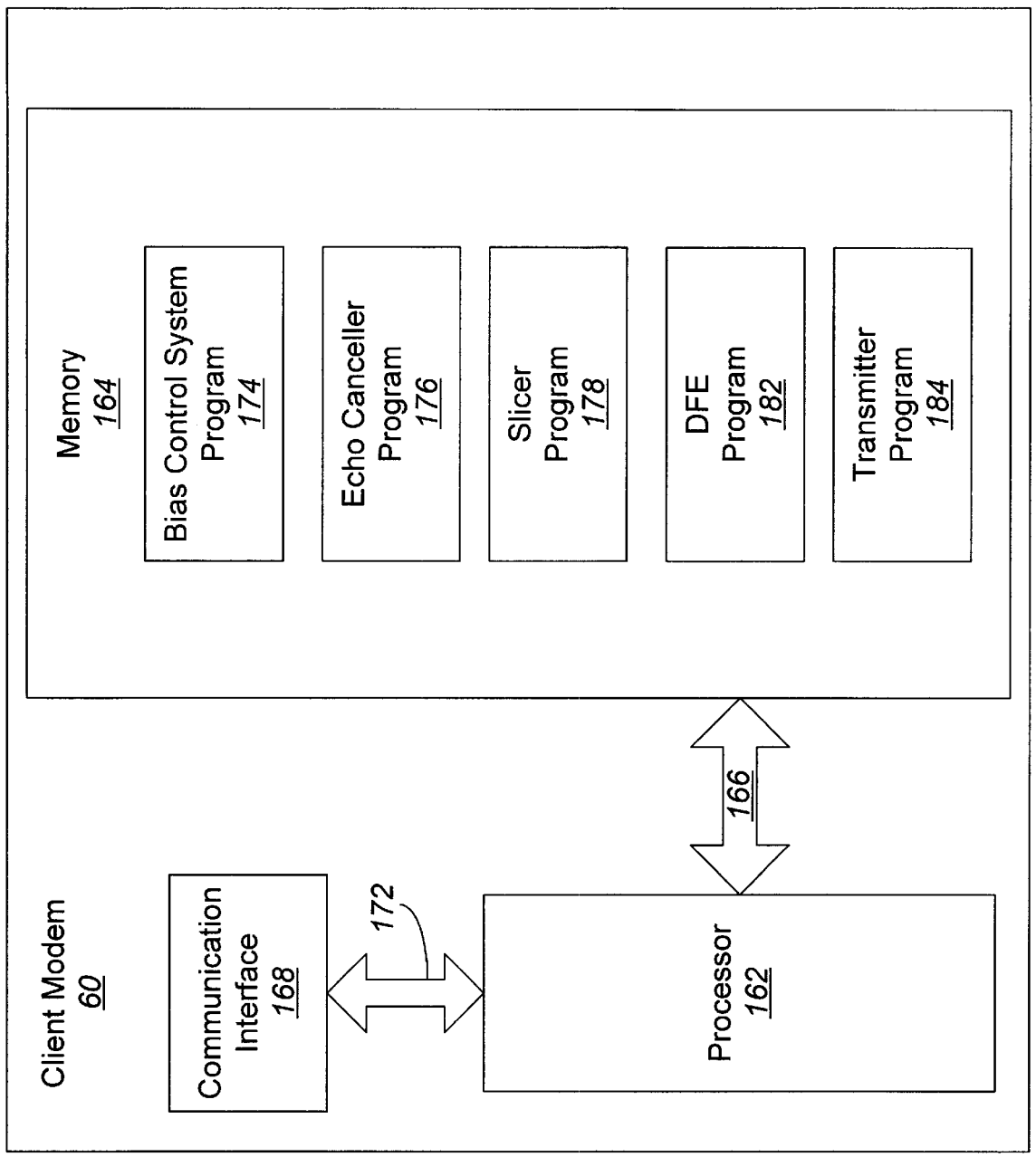
FIG. 6 is a block diagram illustrating a software architecture of a receiver shown in FIG. 3.

Referring now to FIG. 6, a software architecture for the receiver 64 and echo canceller 66 of the V.90 client modem 60 will be described. The client modem 60 includes a processor 162, preferably a digital signal processor, which communicates with a memory 164 via an address/data bus 166. In addition, the processor 162 may receive and transmit information to external devices via a communication interface 168, which is accessed through an input/output (I/O) bus 172. The processor 162 may be any commercially available or custom processor suitable for a real-time intensive embedded application. The memory 164 is representative of the overall hierarchy of memory devices containing the software and data used to implement the functionality of the V.90 client modem 60. The memory 164 may include, but is not limited to, the following types of devices: cache, ROM, PROM, EPROM, EEPROM, flash, SRAM, and DRAM. As shown in FIG. 6, the memory 164 includes program modules for implementing the functionality of the components discussed in the foregoing with reference to FIGS. 3 and 4. That is, the memory 164 includes a bias control system program module 174, an echo canceller program module 176, a slicer program module 178, a decision feedback equalizer (DFE) program module 182, and a transmitter program module 184. Each of these program modules corresponds to a respective component of the V.90 client modem 60 shown in FIGS. 3 and 4. It should be understood that the memory 164 includes additional program modules for implementing additional functionality of the V.90 client modem 60, which are not shown in FIG. 6.

The present invention is described herein with reference to flowchart and/or block diagram illustrations of methods, apparatus (systems), and computer program products according to an embodiment of the invention. It will be understood that each block of the flowchart and/or block diagram illustrations, and combinations of blocks in the flowchart and/or block diagram illustrations, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer-usable or computer-readable memory that can direct a computer or other programmable data processing apparatus to function in a particular manner, such that the instructions stored in the computer-usable or computer-readable memory produce an article of manufacture including instruction means that implement the function specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

Operations and features provided by the bias control system program module 174 will be described hereafter with reference to the flow chart of FIGS. 7A and 7B and the architectural diagrams of FIGS. 3, 4, and 6.

Equalizer Bias Control

As discussed hereinbefore, during startup procedures for a V.90 client modem, a server modem sends a binary signal to the client modem for use in training the equalizer in the V.90 client modems receiver. The training signal may, however, be altered by digital impairments in the network such as digital attenuation PADs and RBS. Moreover, digital attenuation PADs and RBS may not have a uniform effect on all six of the data frame intervals used in V.90 communication. As a result, digital impairments may cause the PAM signal level for the training signal to be biased away from its ideal level in one or more of the six data frame intervals, but have no effect in other data frame intervals. The equalizer in the client modem may adjust its coefficients during the training procedure to adapt to both the biased training signal PAM levels (i.e., those affected by digital impairments) and the unbiased training signal PAM levels, which results in a compromise set of equalizer coefficients that are biased away from the values that would be attained absent the effects of digital impairments in the network.

Accordingly, the bias control system 90, under the control of the bias control system program module 174, may be used to control the undesirable bias that may be introduced into the equalizer filter coefficients as a result of digital impairments, such as digital attenuation PADs and RBS in the network. Operations of the bias control system 90 and bias control system program module 174 are described hereafter.

Figure 7A:
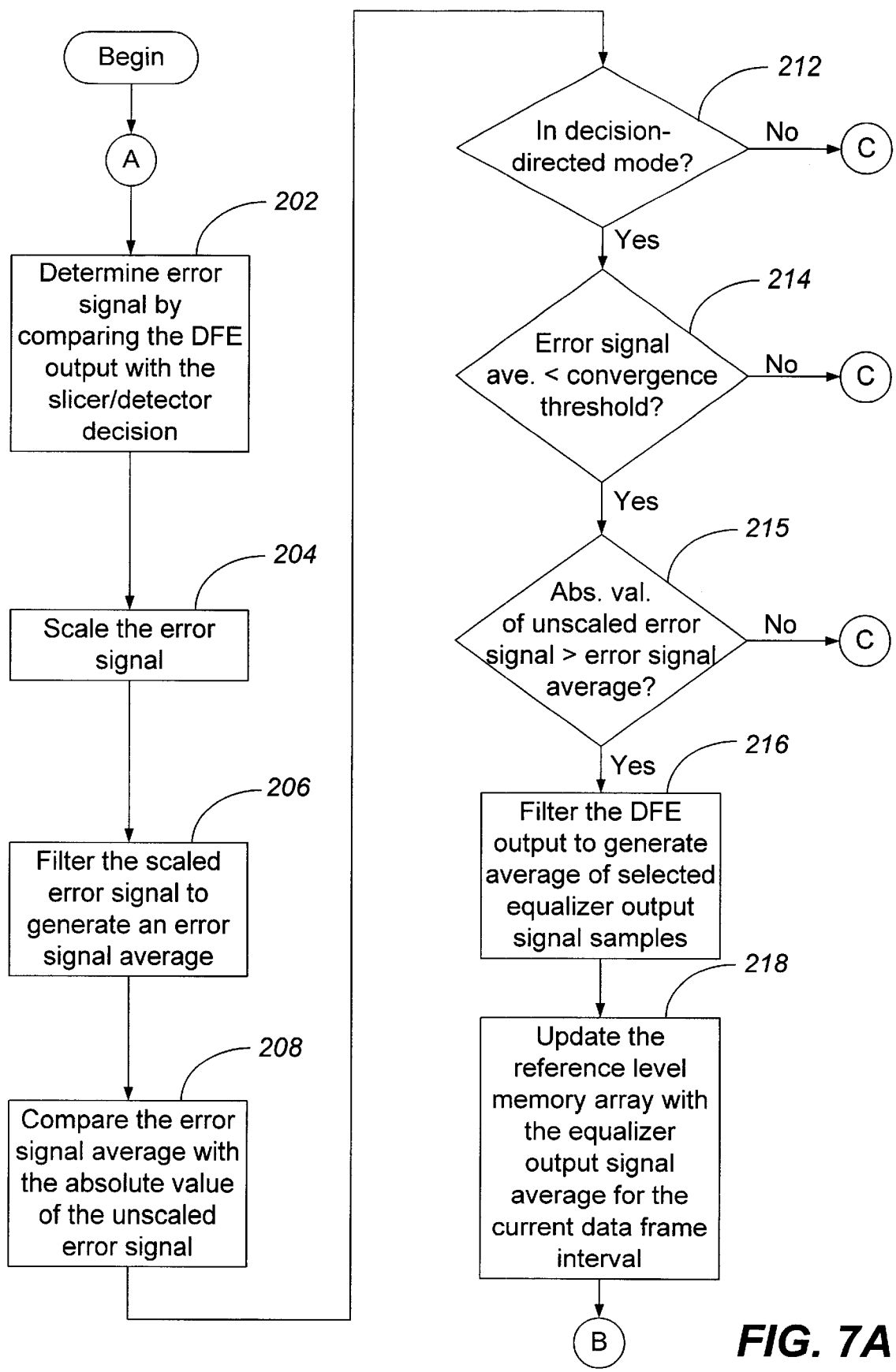
FIGS. 7A–7B are a flow chart that illustrates operations of bias control systems, methods, and computer program products of FIGS. 3–6 in accordance with the present invention.

With reference to FIG. 7A and FIG. 4, at block 202, the adder 126 generates the error signal, which is defined as the difference between the received signal at the input of the slicer/detector 88 and the detected signal as determined by the slicer/detector 88. The error signal may optionally be scaled by the multiplier 128 at block 204 using an appropriate scaling constant or factor. In a preferred embodiment of the bias control system 90, the constant 132 is set to four. After scaling the error signal by the desired constant or factor, the scaled error signal is provided to the filter/averaging circuit 134 at block 206, which maintains a running average of the scaled error signal. This running average may also be called an "error limit value."

In a preferred embodiment of the bias control system 90, the filter/averaging circuit 134 generates the error signal average or error limit value by multiplying a previous error signal average or error limit value by a first weight factor to compute a first component and multiplying the absolute value of the scaled error signal by a second weight factor to compute a second component. The first and second components are added together to generate the new error signal average or error limit value. The weight factors are preferably fractional values whose sum equals one. In a preferred embodiment, the first weight factor is set to $31/32$ and the second weight factor is set to $1/32$. Because a new error signal average is generated using a previous error signal average, the error signal average may be assigned some initial value or the first and second weight factors may be modified to temporarily weight the scaled error signal more heavily than the previous error signal average. The weight factors may be determined experimentally for a particular application and are preferably each based on a power of two for computational efficiency.

Operations of the bias control system 90 continue at block 208 where the comparator 136 compares the error signal average or error limit value with the (unscaled) error signal from the adder 126. Further operations of the bias control system 90 may be based on the state of the decision feedback equalizer 84 as described hereafter.

The decision feedback equalizer 84 may be characterized as being in one of two states during startup. Typically, the decision feedback equalizer starts out in a "reference-directed" mode in which the slicer/detector 88 compares the signal samples output from the decision feedback equalizer against ideal indexed reference signal levels. The error signal generated from the difference between the received signal at the input of the slicer/detector 88 and the detected signal as determined by the slicer/detector 88 is used to update the decision feedback equalizer 84 filter coefficients using the least mean squares (LMS) algorithm. Once the decision feedback equalizer 84 has converged to the point where the decision error (i.e., error signal) is small enough to result in reliable decisions, the equalizer switches to a "decision-directed" mode in which the slicer/detector 88 uses indexed reference signal levels that may vary from the ideal levels because they take into account the characteristics of the communication channel and/or network that have been learned by the modem receiver 64.

Accordingly, a determination is made at block 212 regarding the current mode or state of the decision feedback equalizer 84. In addition, a second determination may be made at block 214 whether the error signal average generated at block 206 is less than an error convergence threshold. The error convergence threshold may be used to ensure that even though the equalizer has switched to decision-directed mode, the error signal is sufficiently small to indicate that the decision feedback equalizer has indeed converged and is stable.

At block 215, the comparator 136 determines whether the absolute value of the error signal from the adder 126 is greater than the error signal average or error limit value. If the decision feedback equalizer 84 is in decision-directed mode, the error signal average is less than the error convergence threshold, and the absolute value of the error signal from the adder 126 is greater than the error signal average or error limit value as determined at blocks 212, 214 and 215, respectively, then it is assumed that this large error is due to an inaccurate reference signal or PAM reference level used by the slicer/detector 88 in making its decisions. Recall that the error signal average is a running average that is typically generated after a scaling factor has been applied to the error signal samples. The scaling constant 132 may be adjusted so that the error signal average is a suitable threshold for concluding that the error signal from the adder 126 is sufficiently large to indicate that the reference signal or PAM reference level used by the slicer/detector 88 is inaccurate.

If the decision feedback equalizer 84 is in decision-directed mode, the error signal average is less than the error convergence threshold, and the absolute value of the error signal from the adder 126 is greater than the error signal average or error limit value, then the filter/averaging circuit 142 generates an equalizer output signal average using the signal sample currently output from the decision feedback equalizer 84 at block 216. In a preferred embodiment of the bias control system 90, the filter/averaging circuit 142 generates the equalizer output signal average by multiplying the magnitude of the reference signal, which is stored in the reference level memory array 144, for the current data frame interval (i.e., the data frame interval associated with the current signal sample that is output from the decision feedback equalizer 84) by a first weight factor to compute a first component and multiplying the signal sample that is currently output from the decision feedback equalizer 84 by a second weight factor to compute a second component. The first and second components are added together to generate the new equalizer output signal average. The weight factors are preferably fractional values whose sum equals one. In a preferred embodiment, the first weight factor is set to $63/64$ and the second weight factor is set to $1/64$. The weight factors may be determined experimentally for a particular application and are preferably each based on a power of two for computational efficiency.

Recall that V.90 uses a framing structure comprising six data frame intervals. Therefore, a separate equalizer output signal average is preferably maintained for each of the six data frame intervals. It should also be noted that the reference level memory array 144 is typically populated initially with the magnitude of the ideal reference signal or reference level for the training symbol, which is used during reference-directed mode.

The comparator 136 asserts the reference update signal at block 218 to enable the filter/averaging circuit 142 to update the reference level memory array 144 by updating the magnitude of the reference signal or PAM reference level stored therein for the current data frame interval to correspond to the average of selected equalizer output signal samples generated at block 216.

Figure 7B:
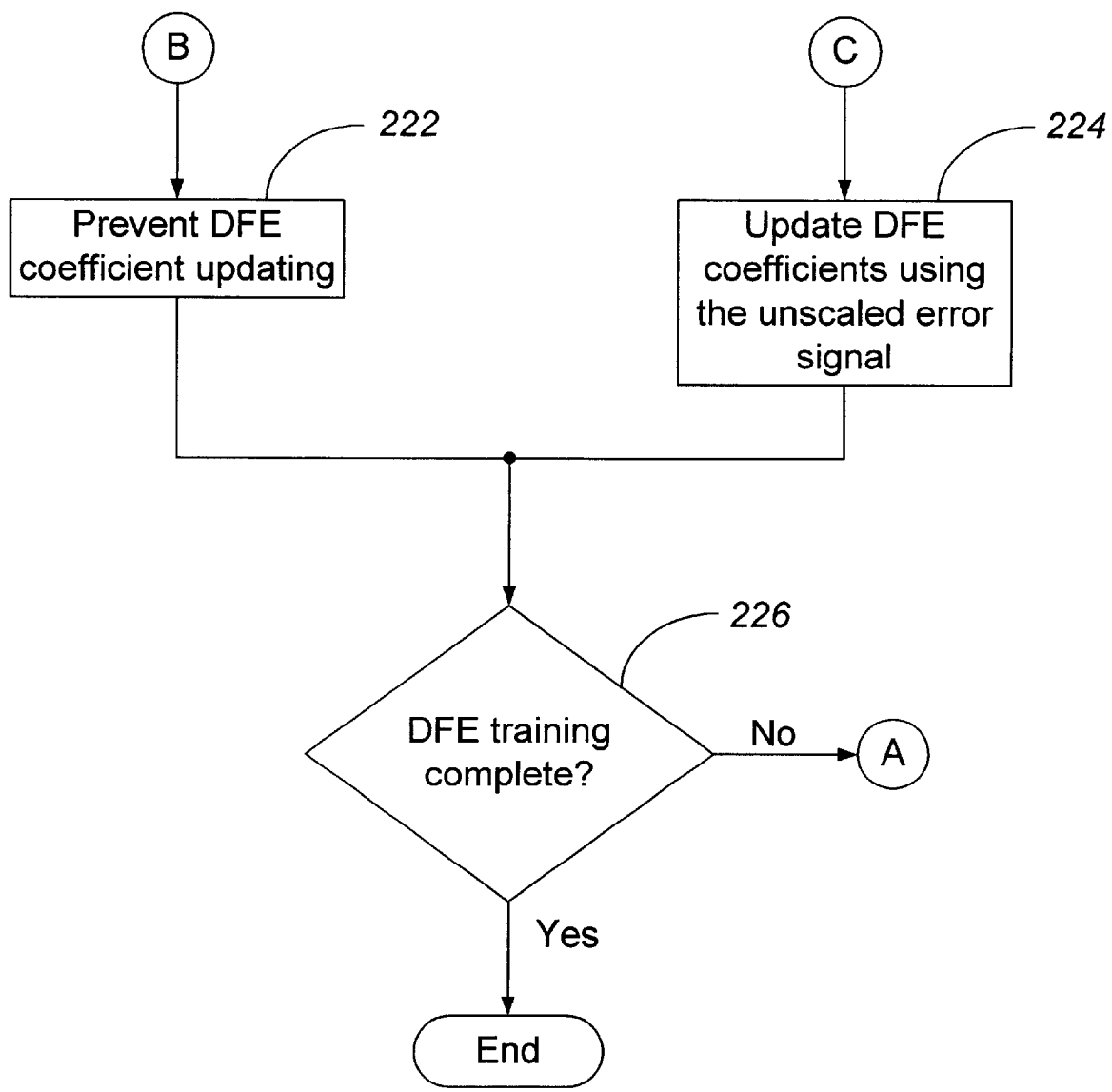

Following connector B to FIG. 7B, the comparator 136 prevents assertion of the coefficient update signal at block 222 to ensure that the gate 138 remains open so that the error signal from the adder 126 is not coupled to the decision feedback equalizer 84 for use in updating the filter coefficients. From the perspective of the decision feedback equalizer 84, this has the effect of forcing the error signal from the adder 126 to zero. As discussed in the foregoing, the large error signal from the adder 126 is presumed to be the result of an inaccurate reference signal or PAM reference level. Thus, the decision feedback equalizer 84 is prevented from detuning its coefficients in response to these errors.

Referring again to FIG. 7A, if the decision feedback equalizer 84 is in reference-directed mode, the error signal average is greater than or equal to the error convergence threshold, or the absolute value of the error signal from the adder 126 is less than or equal to the error signal average or error limit value as determined at blocks 212, 214, and 215 respectively, then connector C is followed to FIG. 7B. At block 224, the comparator 136 asserts the coefficient update signal to couple the error signal from the adder 126 to the decision feedback equalizer 84 through the gate 138 for use in updating the decision feedback equalizer 84 filter coefficients. As discussed in the foregoing, while the decision feedback equalizer 84 is in reference-directed mode, the error signal from the adder 126 is used to update the decision feedback equalizer 84 filter coefficients. The filter coefficients will continue to be updated until the decision feedback equalizer 84 has converged to the point where the decision error (i.e., error signal) is small enough to result in reliable decisions.

Once the decision feedback equalizer is in decision-directed mode and the average error is less than the error convergence threshold, it is assumed that if the error signal from the adder 126 is small, then the reference signal or PAM reference level used by the slicer/detector 88 in making its decisions is accurate, and thus does not require additional refinement. This prevents alteration to good reference signals or PAM reference levels when the decision feedback equalizer 84 has not adequately converged yet. Finally, as represented by block 226, operations of the bias control system 90 continue throughout the training procedure for the decision feedback equalizer 84.

Figure 8:
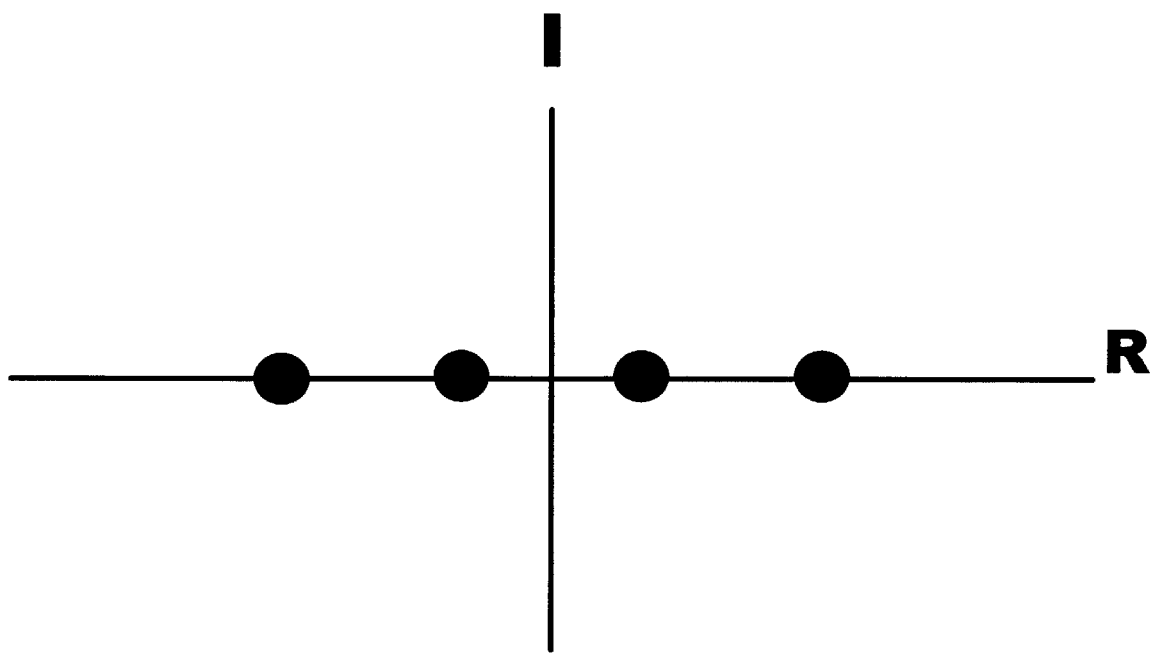
FIG. 8 is a signaling alphabet or constellation point diagram that illustrates pulse amplitude modulation (PAM) reference levels as referenced in FIGS. 7A and 7B.

For purposes of illustration and in no way limited thereto, the bias control system 90 has been discussed herein in connection with a V.90 modem receiver 64 incorporating a decision feedback equalizer 84. It should be understood, however, that the bias control system 90 may be used with alternative equalizer designs and/or in other types of modems (e.g., V.34 modems) or digital signal processing devices. For example, V.90 modems use a signal constellation for transmitting symbols from the server modem to the client modem that comprises PAM reference levels. This is illustrated, for example, in FIG. 8 where a simplified constellation diagram is shown for a signal constellation that comprises four constellation points. Note that for PAM signaling, all constellation points fall on the real axis unlike QAM signaling in which the constellation points fall in the various quadrants in two-dimensional space. QAM signaling may be used, however, for communication between V.34 modems. Therefore, to adapt the bias control system 90 for use in a V.34 environment, the reference signals may be represented in the reference level memory array 144 using both a magnitude and a phase to identify particular constellation points in two-dimensional space.

The flow charts of FIGS. 7A and 7B illustrate the architecture, functionality, and operations of a possible implementation of the client modem receiver 64 software. In this regard, each block represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order, depending upon the functionality involved.

While the present invention has been illustrated and described in detail in the drawings and foregoing description, it is understood that the embodiments shown are merely exemplary. Moreover, it is understood that many variations and modifications can be made to the embodiments described hereinabove without substantially departing from the principles of the present invention. All such variations and modifications are intended to be included herein within the scope of the present invention, as set forth in the following claims.

We claim:

1. A bias control system for an equalizer, comprising:

an adder that is responsive to a reference signal and an equalizer output signal and generates an error signal that corresponds to a difference between the reference signal and the equalizer output signal;

a first filter circuit that is responsive to the error signal and generates an error signal average; and a comparator that is responsive to the error signal and the error signal average and that allows the error signal to propagate to the equalizer for use in coefficient updating if the error signal average is at least as great as an absolute value of the error signal.

2. A bias control system as recited in claim 1, wherein the comparator generates a coefficient update signal to allow the error signal to propagate to the equalizer and the bias control system further comprises:

a gate that couples the error signal to the equalizer in response to the coefficient update signal.

3. A bias control system as recited in claim 1, further comprising:

a second filter that generates an average of selected equalizer output signal samples; and wherein the comparator allows the reference signal to be updated to correspond to the average of selected equalizer output signal samples if the absolute value of the error signal is greater than the error signal average.

4. A bias control system as recited in claim 3, wherein the comparator generates a reference update signal and the bias control system further comprises:

a reference level memory array that contains a magnitude of the reference signal for each of a plurality of data frame intervals, the second filter circuit being responsive to the reference level update signal to update the magnitude of the reference signal for one of the plurality of data frame intervals to correspond to the average of selected equalizer output signal samples if the absolute value of the error signal is greater than the error signal average.

5. A bias control system as recited in claim 4, further comprising a data frame interval counter that generates a data frame interval output signal that identifies the one of the plurality of data frame intervals.

6. A bias control system as recited in claim 1, further comprising a scaling circuit that scales the error signal and provides the scaled error signal to the first filter circuit.

7. A method of controlling bias in an equalizer, comprising the steps of:

generating an error signal that corresponds to a difference between a reference signal and an equalizer output signal;

generating an error signal average; and coupling the error signal to the equalizer for use in coefficient updating if the error signal average is at least as great as an absolute value of the error signal.

8. A method as recited in claim 7, further comprising the steps of:
generating an average of selected equalizer output signal samples; and
updating the reference signal to correspond to the average of selected equalizer output signal samples if the absolute value of the error signal is greater than the error signal average.

9. A method as recited in claim 8, wherein the updating step comprises the step of:
updating the reference signal to correspond to the average of selected equalizer output signal samples if the absolute value of the error signal is greater than the error signal average and the equalizer is in a decision-directed mode.

10. A method as recited in claim 8, wherein the updating step comprises the step of:
updating the reference signal to correspond to the average of selected equalizer output signal samples if the absolute value of the error signal is greater than the error signal average and the error signal average is less than an error convergence threshold.

11. A method as recited in claim 8, further comprising the step of:
storing a magnitude of the reference signal for each of a plurality of data frame intervals.

12. A method as recited in claim 11, wherein the updating step comprises the step of:
updating the magnitude of the reference signal for one of the plurality of data frame intervals to correspond to the average of selected equalizer output signal samples if the absolute value of the error signal is greater than the error signal average.

13. A method as recited in claim 11, wherein the step of generating the average of selected equalizer output signal samples comprises the steps of:
computing a first component by multiplying the magnitude of the reference signal for one of the plurality of data frame intervals by a first weight factor (WF1);
computing a second component by multiplying the equalizer output signal by a second weight factor (WF2); and
adding the first component to the second component to generate the average of selected equalizer output signal samples.

14. A method as recited in claim 13, wherein:
the WF1 is between zero and one;
the WF2 is between zero and one; and
the WF1 plus the WF2 is about one.

15. A method as recited in claim 13, wherein the WF1 is about $63/64$ and the WF2 is about $1/64$.

16. A method as recited in claim 7, wherein the step of generating the error signal average comprises the steps of:
computing a first error signal average component by multiplying a previous error signal average by a first weight factor (WF1);
computing a second error signal average component by multiplying the absolute value of the error signal by a second weight factor (WF2); and
adding the first error signal average component to the second error signal average component to generate the error signal average.

17. A method as recited in claim 16, wherein:
the WF1 is between zero and one;
the WF2 is between zero and one; and
the WF1 plus the WF2 is about one.

18. A method as recited in claim 16, wherein the WF1 is about $31/32$ and the WF2 is about $1/32$.

19. A method as recited in claim 7, wherein the coupling step comprises the steps of:
coupling the error signal to the equalizer for use in coefficient updating if the error signal average is at least as great as the absolute value of the error signal;
coupling the error signal to the equalizer for use in coefficient updating if the equalizer is in a reference-directed mode; and
coupling the error signal to the equalizer for use in coefficient updating if the error signal average is at least as great as an error convergence threshold.

20. A method as recited in claim 7, wherein the step of generating the error signal average comprises the steps of:
scaling the error signal; and
generating the error signal average using the scaled error signal.

21. A computer program product for controlling bias in an equalizer, comprising:
a computer readable storage medium having computer readable program code embodied therein, the computer readable program code comprising:
computer readable program code for generating an error signal that corresponds to a difference between a reference signal and an equalizer output signal;
computer readable program code for generating an error signal average; and
computer readable program code for coupling the error signal to the equalizer for use in coefficient updating if the error signal average is at least as great as the absolute value of the error signal.

22. A computer program product as recited in claim 21, further comprising:
computer readable program code for generating an average of selected equalizer output signal samples; and
computer readable program code for updating the reference signal to correspond to the average of selected equalizer output signal samples if the absolute value of the error signal is greater than the error signal average.

23. A computer program product as recited in claim 22, wherein the computer readable program code for updating comprises:
computer readable program code for updating the reference signal to correspond to the average of selected equalizer output signal samples if the absolute value of the error signal is greater than the error signal average and the equalizer is in a decision-directed mode.

24. A computer program product as recited in claim 22, wherein the computer readable program code for updating comprises:
computer readable program code for updating the reference signal to correspond to the average of selected equalizer output signal samples if the error signal average is less than an error convergence threshold.

25. A computer program product as recited in claim 22, further comprising:
computer readable program code for storing a magnitude of the reference signal for each of a plurality of data frame intervals.

26. A computer program product as recited in claim 25, wherein the computer readable program code for updating comprises:
computer readable program code for updating the magnitude of the reference signal for one of the plurality of data frame intervals to correspond to the average of selected equalizer output signal samples if the absolute value of the error signal is greater than the error signal average.

27. A computer program product as recited in claim 25, wherein the computer readable program code for generating the average of selected equalizer output signal samples comprises:
   computer readable program code for computing a first component by multiplying the magnitude of the reference signal for one of the plurality of data frame intervals by a first weight factor (WF1);
   computer readable program code for computing a second component by multiplying the equalizer output signal by a second weight factor (WF2); and
   computer readable program code for adding the first component to the second component to generate the average of selected equalizer output signal samples.

28. A computer program product as recited in claim 27, wherein:
   the WF1 is between zero and one;
   the WF2 is between zero and one; and
   the WF1 plus the WF2 is about one.

29. A computer program product as recited in claim 27, wherein the WF1 is about $63/64$ and the WF2 is about $1/64$.

30. A computer program product as recited in claim 21, wherein the computer readable program code for generating the error signal average comprises:
   computer readable program code for computing a first error signal average component by multiplying a previous error signal average by a first weight factor (WF1);
   computer readable program code for computing a second error signal average component by multiplying the absolute value of the error signal by a second weight factor (WF2); and
   computer readable program code for adding the first error signal average component to the second error signal average component to generate the error signal average.

31. A computer program product as recited in claim 30, wherein:
   the WF1 is between zero and one;
   the WF2 is between zero and one; and
   the WF1 plus the WF2 is about one.

32. A computer program product as recited in claim 30, wherein the WF1 is about $31/32$ and the WF2 is about $1/32$.

33. A computer program product as recited in claim 21, wherein the computer readable program code for coupling comprises:
   computer readable program code for coupling the error signal to the equalizer for use in coefficient updating if the error signal average is at least as great as the absolute value of the error signal;
   computer readable program code for coupling the error signal to the equalizer for use in coefficient updating if the equalizer is in a reference-directed mode; and
   computer readable program code for coupling the error signal to the equalizer for use in coefficient updating if the error signal average is at least as great as an error convergence threshold.

34. A computer program product as recited in claim 21, wherein the computer readable program code for generating the error signal average comprises:
   computer readable program code for scaling the error signal; and
   computer readable program code for generating the error signal average using the scaled error signal.

35. A bias control system for an equalizer, comprising:
   means for generating an error signal that corresponds to a difference between a reference signal and an equalizer output signal;
   means for generating an error signal average; and
   means for coupling the error signal to the equalizer for use in coefficient updating if the error signal average is at least as great as an absolute value of the error signal.

36. A system as recited in claim 35, further comprising:
   means for generating an average of selected equalizer output signal samples; and
   means for updating the reference signal to correspond to the average of selected equalizer output signal samples if the absolute value of the error signal is greater than the error signal average.

37. A system as recited in claim 36, wherein the means for updating comprises:
   means for updating the reference signal to correspond to the average of selected equalizer output signal samples if the absolute value of the error signal is greater than the error signal average and the equalizer is in a decision-directed mode.

38. A system as recited in claim 36, wherein the means for updating comprises:
   means for updating the reference signal to correspond to the average of selected equalizer output signal samples if the absolute value of the error signal is greater than the error signal average and the error signal average is less than an error convergence threshold.

39. A system as recited in claim 36, further comprising:
   means for storing a magnitude of the reference signal for each of a plurality of data frame intervals.

40. A system as recited in claim 39, wherein the means for updating comprises:
   means for updating the magnitude of the reference signal for one of the plurality of data frame intervals to correspond to the average of selected equalizer output signal samples if the absolute value of the error signal is greater than the error signal average.

41. A system as recited in claim 39, wherein the means for generating the average of selected equalizer output signal samples comprises:
   means for computing a first component by multiplying the magnitude of the reference signal for one of the plurality of data frame intervals by a first weight factor (WF1);
   means for computing a second component by multiplying the equalizer output signal by a second weight factor (WF2); and
   means for adding the first component to the second component to generate the average of selected equalizer output signal samples.

42. A system as recited in claim 39, wherein:
   the WF1 is between zero and one;
   the WF2 is between zero and one; and
   the WF1 plus the WF2 is about one.

43. A system as recited in claim 39, wherein the WF1 is about $63/64$ and the WF2 is about $1/64$.

44. A system as recited in claim 35, wherein the means for generating the error signal average comprises:

means for computing a first error signal average component by multiplying a previous error signal average by a first weight factor (WF1);

means for computing a second error signal average component by multiplying the absolute value of the error signal by a second weight factor (WF2); and means for adding the first error signal average component to the second error signal average component to generate the error signal average.

45. A system as recited in claim 44, wherein:

the WF1 is between zero and one;

the WF2 is between zero and one; and the WF1 plus the WF2 is about one.

46. A system as recited in claim 44, wherein the WF1 is about $31/32$ and the WF2 is about $1/32$.

47. A system as recited in claim 35, wherein the means for coupling comprises:

means for coupling the error signal to the equalizer for use in coefficient updating if the error signal average is at least as great as the absolute value of the error signal;

means for coupling the error signal to the equalizer for use in coefficient updating if the equalizer is in a reference-directed mode; and means for coupling the error signal to the equalizer for use in coefficient updating if the error signal average is at least as great as an error convergence threshold.

48. A system as recited in claim 35, wherein the means for generating the error signal average comprises:

means for scaling the error signal; and means for generating the error signal average using the scaled error signal.

* * * * *